(12) United States Patent
Dasgupta et al.

(10) Patent No.: US 10,475,888 B2
(45) Date of Patent: *Nov. 12, 2019

(54) INTEGRATION OF III-V DEVICES ON SI WAFERS

(71) Applicant: Intel Corporation, Santa Clara, CA (US)

(72) Inventors: Sansaptak Dasgupta, Hillsboro, OR (US); Han Wui Then, Portland, OR (US); Seung Hoon Sung, Portland, OR (US); Sanaz K. Gardner, Portland, OR (US); Marko Radosavljevic, Beaverton, OR (US); Benjamin Chu-Kung, Portland, OR (US); Robert S. Chau, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/492,785

(22) Filed: Apr. 20, 2017

(65) Prior Publication Data

US 2017/0221999 A1 Aug. 3, 2017

Related U.S. Application Data

(63) Continuation of application No. 14/908,112, filed as application No. PCT/US2013/062481 on Sep. 27, 2013, now Pat. No. 9,673,045.

(51) Int. Cl.
*H01L 29/20* (2006.01)
*H01L 29/04* (2006.01)
(Continued)

(52) U.S. Cl.
CPC .... *H01L 29/2003* (2013.01); *H01L 21/02381* (2013.01); *H01L 21/3085* (2013.01);
(Continued)

(58) Field of Classification Search
None
See application file for complete search history.

(56) References Cited

U.S. PATENT DOCUMENTS

| 6,606,635 B1 | 8/2003 | Kuramata et al. |
| 2002/0090816 A1 | 7/2002 | Ashby et al. |

(Continued)

FOREIGN PATENT DOCUMENTS

| CN | 1633700 | 6/2005 |
| CN | 101853808 | 10/2010 |

(Continued)

OTHER PUBLICATIONS

Office Action from Chinese Patent Application No. 201380079246.6, dated Jan. 26, 2018, 10 pages.

(Continued)

*Primary Examiner* — Thien F Tran
(74) *Attorney, Agent, or Firm* — Schwabe, Williamson & Wyatt, P.C.

(57) ABSTRACT

An insulating layer is conformally deposited on a plurality of mesa structures in a trench on a substrate. The insulating layer fills a space outside the mesa structures. A nucleation layer is deposited on the mesa structures. A III-V material layer is deposited on the nucleation layer. The III-V material layer is laterally grown over the insulating layer.

18 Claims, 17 Drawing Sheets

(51) Int. Cl.
   *H01L 29/06*     (2006.01)
   *H01L 29/66*     (2006.01)
   *H01L 21/308*    (2006.01)
   *H01L 21/02*     (2006.01)

(52) U.S. Cl.
   CPC ........ *H01L 29/045* (2013.01); *H01L 29/0649* (2013.01); *H01L 29/0688* (2013.01); *H01L 29/66477* (2013.01)

(56) References Cited

U.S. PATENT DOCUMENTS

| | | |
|---|---|---|
| 2004/0173850 A1 | 9/2004 | Yeo |
| 2007/0132022 A1 | 6/2007 | Son et al. |
| 2007/0281446 A1 | 12/2007 | Winstead et al. |
| 2007/0281466 A1 | 12/2007 | Winstead et al. |
| 2010/0044719 A1 | 2/2010 | Yu et al. |
| 2010/0068866 A1 | 3/2010 | Yu et al. |
| 2010/0090312 A1 | 4/2010 | Guo et al. |
| 2012/0161148 A1 | 6/2012 | Fang et al. |
| 2013/0082281 A1 | 4/2013 | LaRoche et al. |

FOREIGN PATENT DOCUMENTS

| | | |
|---|---|---|
| EP | 1280190 A1 | 1/2003 |
| KR | 10-2007-0097640 | 10/2007 |
| TW | 201009899 | 3/2010 |
| TW | 201318055 A | 5/2013 |
| WO | WO 2011/135432 A1 | 11/2011 |

OTHER PUBLICATIONS

International Preliminary Report on Patentability for PCT/US2013/062481, dated Apr. 7, 2016, 7 pages.
Office Action from U.S. Appl. No. 14/908,112, dated Aug. 25, 2016, 9 pages.
Notice of Allowance from U.S. Appl. No. 14/908,112, dated Feb. 13, 2017, 7 pages.
Taiwan (R.O.C.) Patent Application No. 103132261, Notice of Allowance dated Apr. 21, 2016, (Allowed Claims in English) 7 pages.
International Search Report for International Appln. No. PCT/US2013/062481, dated Jun. 26, 2014, 2 pages.
Taiwan (R.O.C.) Patent Application No. 103132261, Office Action and Taiwan IPO Search Report (with English translation), dated Nov. 5, 2015, 6 pages.
European Search Report for European Patent Application No. 13894184.4, dated Mar. 24, 2017.
Office Action from European Patent Application No. 13894184.4, dated May 20, 2019, 7 pages.

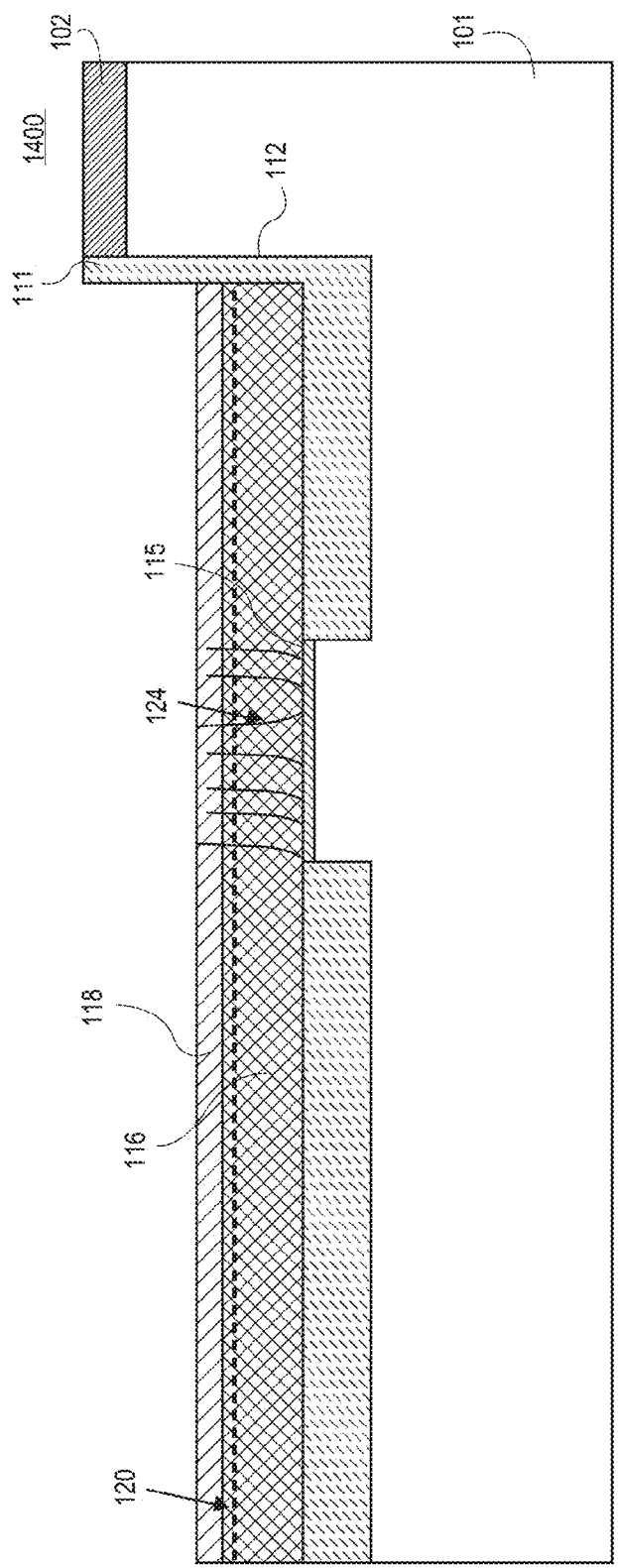
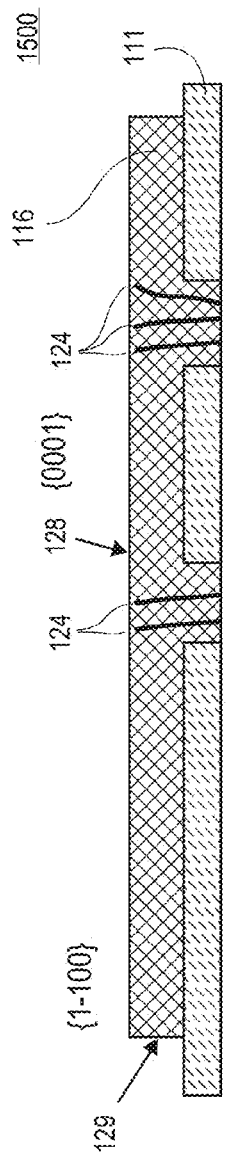
FIG. 14
FIG. 15A

FIG. 21B

INTEGRATION OF III-V DEVICES ON SI WAFERS

This patent application is a continuation of co-pending U.S. application Ser. No. 14/908,112 filed Jan. 27, 2016, which is a U.S. National Phase Application under 35 U.S.C. § 371 of International Application No. PCT/US2013/062481, filed Sep. 27, 2013, entitled "INTEGRATION OF III-V DEVICES ON SI WAFERS".

TECHNICAL FIELD

Embodiments as described herein relate to the field of electronic systems manufacturing, and in particular, to manufacturing III-V material based devices.

BACKGROUND ART

Generally, to integrate III-V materials on a silicon ("Si") substrate aligned along a <100> crystal orientation ("Si (100)") for system-on-chip ("SoC") high voltage and radio frequency ("RF") devices with Complementary Metal Oxide Semiconductor ("CMOS") transistors, great challenges arise due to dissimilar lattice properties of the III-V materials and silicon. Typically, when a III-V material is grown on a silicon ("Si") substrate defects are generated due to the lattice mismatch between the III-V material and Si. These defects can reduce the mobility of carriers (e.g., electrons, holes, or both) in the III-V materials.

Currently, integration of GaN (or any other III-N material) on Si (100) wafer involves the use of thick buffer layers (>1.5 um) and starting miscut Si (100) wafer with 2-8° miscut angle to obtain a low enough defect density layer for the growth of the device layers. Typically, integration of GaN (or any other III-N material) on Si (100) wafer involves a blanket epitaxial growth process which occurs over the entire wafer and is not selective area or pattern specific. Additionally, current techniques do not provide a pathway for co-integration of both GaN transistors and Si CMOS circuits in close proximity to each other.

BRIEF DESCRIPTION OF THE DRAWINGS

FIG. 14 is a cross-sectional view of a portion of a structure shown in FIG. 12 to demonstrate advantages of depositing the LEO portions of the III-V material layer on the insulating layer 111 according to one embodiment.

FIG. 15A is a cross-sectional view 1500 of a portion of a structure shown in FIG. 14 to demonstrate lateral overgrowth of the III-V material layer according to one embodiment.

FIG. 21B is a view similar to FIG. 21A, after the insulating layer on the hard mask is removed according to one embodiment.

DESCRIPTION OF THE EMBODIMENTS

Figure 1:
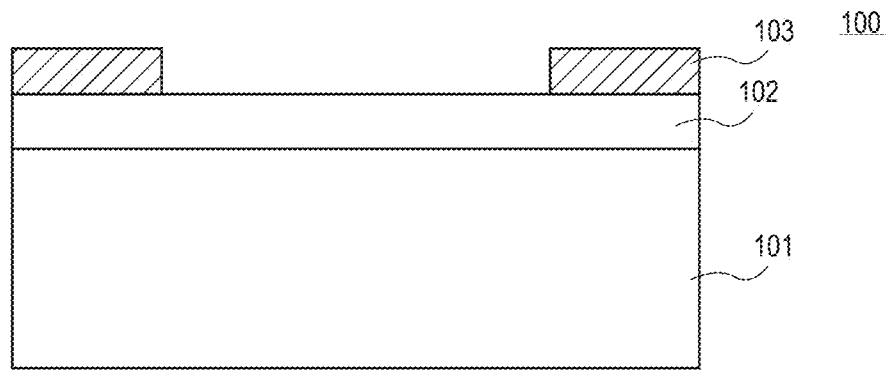
FIG. 1 shows a cross-sectional view of an electronic device structure according to one embodiment.

In the following description, numerous specific details, such as specific materials, dimensions of the elements, etc. are set forth in order to provide thorough understanding of one or more of the embodiments as described herein. It will be apparent, however, to one of ordinary skill in the art that the one or more embodiments as described herein may be practiced without these specific details. In other instances, semiconductor fabrication processes, techniques, materials, equipment, etc., have not been described in great detail to avoid unnecessary obscuring of this description.

While certain exemplary embodiments are described and shown in the accompanying drawings, it is to be understood that such embodiments are merely illustrative and not restrictive, and that the embodiments are not restricted to the specific constructions and arrangements shown and described because modifications may occur to those ordinarily skilled in the art.

Reference throughout the specification to "one embodiment", "another embodiment", or "an embodiment" means that a particular feature, structure, or characteristic described in connection with the embodiment is included in at least one embodiment. Thus, the appearance of the phrases, such as "one embodiment" and "an embodiment" in various places throughout the specification are not necessarily all referring to the same embodiment. Furthermore, the particular features, structures, or characteristics may be combined in any suitable manner in one or more embodiments.

Moreover, inventive aspects lie in less than all the features of a single disclosed embodiment. Thus, the claims following the Detailed Description are hereby expressly incorporated into this Detailed Description, with each claim standing on its own as a separate embodiment. While the exemplary embodiments have been described herein, those skilled in the art will recognize that these exemplary embodiments can be practiced with modification and alteration as described herein. The description is thus to be regarded as illustrative rather than limiting.

Methods and apparatuses to manufacture an electronic device are described herein. An insulating layer is conformally deposited on a plurality of mesa structures in a trench on a substrate. The insulating layer fills a space outside the mesa structures. A nucleation layer is deposited on the mesa structures. A III-V material layer is deposited on the nucleation layer. The III-V material layer is laterally grown over the insulating layer.

Generally, the III-V material refers to a compound semiconductor material that comprises at least one of group III elements of the periodic table, e.g., aluminum ("Al"), gallium ("Ga"), indium ("In"), and at least one of group V elements of the periodic table, e.g., nitrogen ("N"), phosphorus ("P"), arsenic ("As"), antimony ("Sb"). In at least some embodiments, the substrate includes silicon, and the III-V layer includes GaN.

In at least some embodiments, methods to co-integrate GaN devices (e.g., transistors, and other GaN based devices) for power management integrated circuits ("PMIC") and RF power amplifier ("PA") applications in close proximity to Si Complementary Metal Oxide Semiconductor ("CMOS") circuits for system on chip ("SoC") products are described. In at least some embodiments, an electronic device, e.g., a transistor, or any other electronic device comprising an epitaxially grown III-Nitride ("N") material is formed within small islands embedded in a Si wafer aligned along (100) crystallographical orientation. Forming an electronic device in the islands embedded in a Si wafer aligned along (100) crystallographical orientation allow the co-integration of the III-V material based transistors with both low defect density and low body leakage alongside Si CMOS circuits.

In an embodiment, to integrate GaN on Si (100) for SoC high voltage and RF devices in close proximity of CMOS transistors, GaN transistor stack is grown selectively inside predefined trenches within the Si CMOS wafer. From a device standpoint, the size of the each side of the trench is from about 70 microns ("µm") to about 100 µm. Within the trenches the use of an oxide underlayer allows the implementation of lateral epitaxial overgrowth ("LEO") of GaN resulting in low defect density and low body leakage for the GaN device. In an embodiment, the Si mesas formed break up the continuity of the Si film at the bottom of the trench in the Si substrate that allows to reduce the GaN epitaxial layer stack total thickness comparing to total thickness of the GaN epi stack blanket deposited on the plane Si (100) wafer for the same defect and crack density.

FIG. 1 shows a cross-sectional view 100 of an electronic device structure according to one embodiment. The electronic device structure comprises a substrate 101. In an embodiment, the substrate 101 is a substrate having aligned along a predetermined crystal orientation. Generally, the crystallographic orientations (e.g., (100), (111), (110), and other crystallographical orientations) are known to one of ordinary skill in the art of electronic device manufacturing. In an embodiment, the substrate 101 includes a semiconductor material, e.g., monocrystalline silicon ("Si"), germanium ("Ge"), silicon germanium ("SiGe"), a III-V materials based material e.g., gallium arsenide ("GaAs"), or any combination thereof. In one embodiment, the substrate 101 includes metallization interconnect layers for integrated circuits. In at least some embodiments, the substrate 101 includes electronic devices, e.g., transistors, memories, capacitors, resistors, optoelectronic devices, switches, and any other active and passive electronic devices that are separated by an electrically insulating layer, for example, an interlayer dielectric, a trench insulation layer, or any other insulating layer known to one of ordinary skill in the art of the electronic device manufacturing. In at least some embodiments, the substrate 101 includes interconnects, for example, vias, configured to connect the metallization layers.

In an embodiment, substrate 101 is a semiconductor-on-isolator (SOI) substrate including a bulk lower substrate, a middle insulation layer, and a top monocrystalline layer aligned along a predetermined crystal orientation, for example, <100> crystal orientation. The top monocrystalline layer may comprise any material listed above, e.g., silicon.

In an embodiment, substrate 101 is a silicon substrate aligned along a <100> crystal orientation ("Si (100)"). An insulating layer 102 is deposited on the substrate.

Insulating layer 102 can be any material suitable to insulate adjacent devices and prevent leakage. In one embodiment, electrically insulating layer 102 is an oxide layer, e.g., silicon dioxide, or any other electrically insulating layer determined by an electronic device design. In one embodiment, insulating layer 102 comprises an interlayer dielectric (ILD), e.g., silicon dioxide. In one embodiment, insulating layer 102 may include polyimide, epoxy, photo-definable materials, such as benzocyclobutene (BCB), and WPR-series materials, or spin-on-glass. In one embodiment, insulating layer 102 is a low permittivity (low-k) ILD layer. Typically, low-k is referred to the dielectrics having dielectric constant (permittivity k) lower than the permittivity of silicon dioxide.

In one embodiment, insulating layer 102 is a shallow trench isolation (STI) layer to provide field isolation regions that isolate one island from other islands on substrate 101. In one embodiment, the thickness of the layer 102 is in the approximate range of 20 nanometers ("nm") to 350 nanometers. The insulating layer 102 can be blanket deposited using any of techniques known to one of ordinary skill in the art of electronic device manufacturing, such as but not limited to a chemical vapour deposition (CVD), and a physical vapour deposition (PVD). A patterned layer 103 is formed on the insulating layer 102 to expose portions of the insulating layer 102. In an embodiment, layer 103 is a patterned hard mask layer. The hard mask layer can be patterned using one of patterning and etching techniques known to one of ordinary skill in the art of electronic device manufacturing. In at least some embodiments, hard mask layer 103 comprises an aluminum oxide (e.g., Al2O3); polysilicon, amorphous Silicon, poly germanium ("Ge"), a refractory metal (e.g., tungsten ("W"), molybdenum ("Mo"), or other refractory metal), or any combination thereof. In an embodiment, layer 103 is a photoresist layer.

Figure 2:
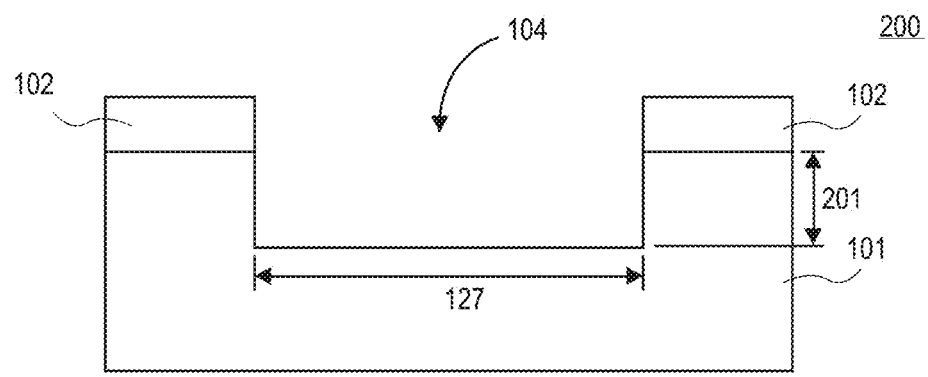
FIG. 2 is a view similar to FIG. 1, after the portions of the insulating layer and substrate are removed according to one embodiment.

FIG. 2 is a view 200 similar to FIG. 1, after the portions of the insulating layer and substrate are removed according to one embodiment. A portion of the insulating layer 102 exposed by hard mask 103 is removed to expose substrate 101. The portion of the insulating layer 102 can be removed using an etching technique known to one of ordinary skill in the art of electronic device manufacturing, such as but not limited to a wet etching, and a dry etching. In an embodiment, insulating layer 104 of silicon oxide is etched using a hydrofluoric acid ("HF") solution.

As shown in FIG. 2, a portion of substrate 101 exposed by insulating layer 102 is removed to form a trench 104. Trench has a depth 201 and a width 127. In an embodiment, depth 201 is from about 2 microns ("μm") to about 3 μm, and width 127 is in from about 20 μm to about 500 μm. In one embodiment, the portion of substrate 101 is etched using one or more etching techniques known to one of ordinary skill in the art of electronic device manufacturing. In an embodiment, an etching solution (e.g., tetramethylammonium hydroxide ("TMAH"), potassium hydroxide ("KOH"), ammonium hydroxide ("NH4OH")) is used to anisotropically etch the Si substrate. In an embodiment, a dry etch using gases SF6, XeF2, BCl3, Cl2, or any combination thereof is used to etch the silicon substrate.

As shown in FIG. 2, hard mask 103 is removed from insulating layer 102. The hard mask can be removed from the insulating layer by a polishing process, such as a chemical-mechanical planarization ("CMP") process as known to one of ordinary skill in the art of electronic device manufacturing.

Figure 11:
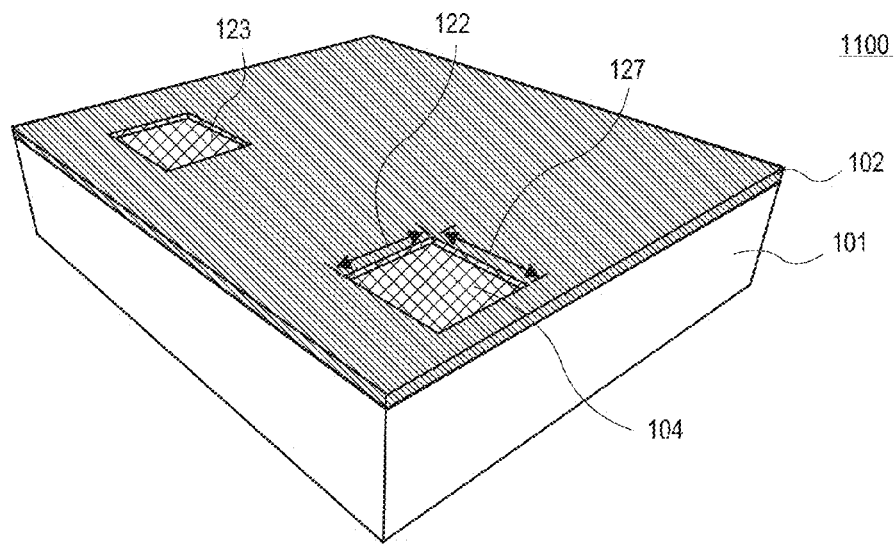
FIG. 11 is a three dimensional view of an electronic device structure a cross-sectional portion of which is depicted in FIG. 2.

FIG. 11 is a three dimensional ("3D") view of an electronic device structure a cross-sectional portion of which is depicted in FIG. 2. As shown in FIG. 11, insulating layer 102 is deposited on substrate 101. Trenches, such as trenches 104 and 123 are formed through insulating layer 102 in the substrate 101, as described above. Trench 104 has a length 122 and width 127. In an embodiment, length 122 is from about 50 μm to about 100 μm, and width 127 is from about 50 μm to about 100 μm. In at least some embodiments, trenches 104 and 123 comprise islands where III-V materials based devices are formed as described in further detail below. In at least some embodiments, insulating layer 102 covers CMOS device areas on substrate 101. In at least some embodiments, the trenches, such as trenches 104 and 123 are created within the Si CMOS wafer prior to Si CMOS processing. In at least some embodiments, the trenches, such as trenches 104 and 123 are predefined by a circuit designer.

Figure 3:
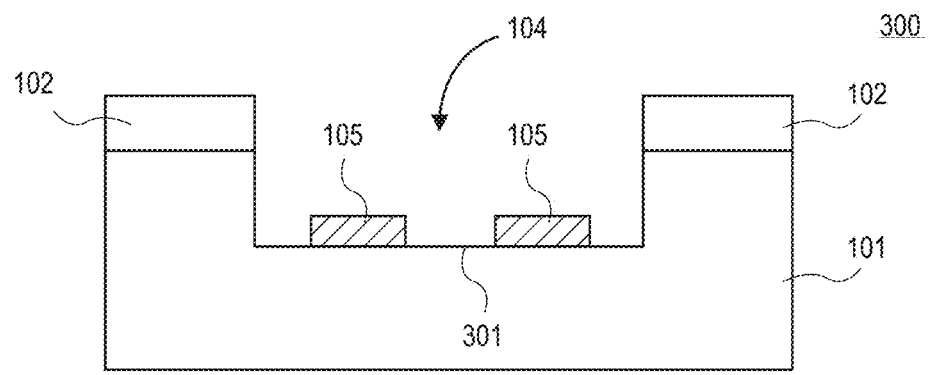
FIG. 3 is a view similar to FIG. 2, after a patterned hard mask layer is formed on a bottom of trench according to one embodiment.

FIG. 3 is a view 300 similar to FIG. 2, after a patterned hard mask layer 105 is formed on a bottom 301 of trench 104 according to one embodiment. The hard mask layer 105 deposited on bottom 301 of trench 104 can be patterned using one of patterning and etching techniques known to one of ordinary skill in the art of electronic device manufacturing. In at least some embodiments, hard mask layer 105 comprises an aluminum oxide (e.g., Al₂O₃); polysilicon, amorphous Silicon, poly germanium ("Ge"), a refractory metal (e.g., tungsten ("W"), molybdenum ("Mo"), or other refractory metal), or any combination thereof.

Figure 4:
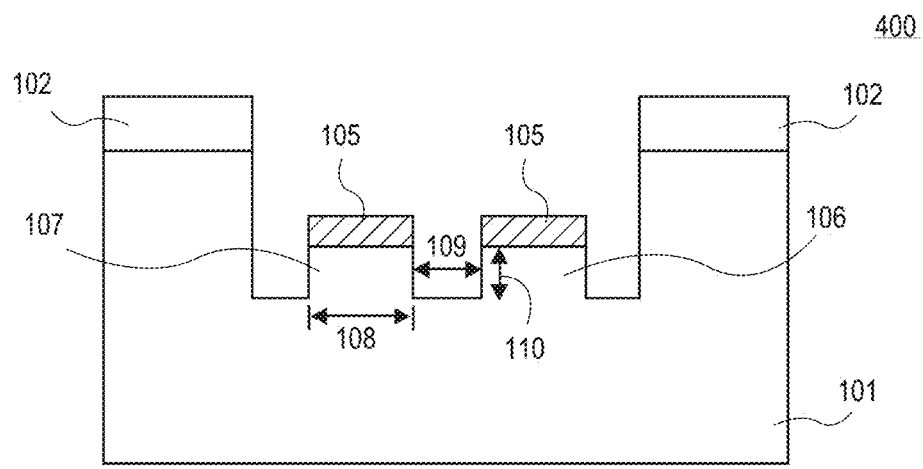
FIG. 4 is a view similar to FIG. 3, after the substrate is etched through the patterned hard mask layer to form a plurality of mesa structures according to one embodiment.

FIG. 4 is a view 400 similar to FIG. 3, after the substrate is etched through the patterned hard mask layer 105 to form a plurality of mesa structures, such as a mesa structure 106 and a mesa structure 107 according to one embodiment. As shown in FIG. 4, the mesa structures have the height, such as a height 110 and the width, such as a width 108. In at least some embodiments, the height of the mesa structure is from about 100 nm to about 500 nm. In at least some embodiments, the width of the mesa structure is from about 5 μm to about 10 μm. Mesa structures are separated by a distance 109. In at least some embodiments, the distance between the mesa structures is predetermined by a ratio of a lateral overgrowth rate to a vertical growth rate of the III-V material layer formed over the mesa structures later on in a process. For example, if the ratio of a lateral overgrowth rate to a vertical growth rate of the III-V material layer is about 10:1, and the thickness of the III-V material layer is about 1 μm, the distance between the mesa structures is about 20 μm. In at least some embodiments, the distance between the mesa structures is from about 1 μm to about 50 μm.

The mesa structures can have a square shape; a rectangular shape, a polygon shape, or any combination thereof.

In an embodiment, within the trenches on the silicon substrate, such as trench 104, there are several silicon mesa structures with exposed silicon surface for III-Nitride ("N") epitaxy. These mesa structures may be square, rectangular or shaped like a polygon and could be oriented in various directions for efficient III-N lateral growth.

In one embodiment, the mesa structures are formed using one or more etching techniques known to one of ordinary skill in the art of electronic device manufacturing. In an embodiment, the mesa structures are formed by etching the portions of Si substrate exposed by patterned hard mask layer within trench using an etching solution (e.g., tetramethylammonium hydroxide ("TMAH"), potassium hydroxide ("KOH"), ammonium hydroxide ("NH4OH")). In an embodiment, the mesa structures are formed by dry etching the portions of Si substrate exposed by patterned hard mask layer within trench using gases SF6, XeF2, BCl3, Cl2, or any combination thereof. In an embodiment, the mesa structure 104 is oriented along a predetermined crystallographical direction.

Figure 15B:
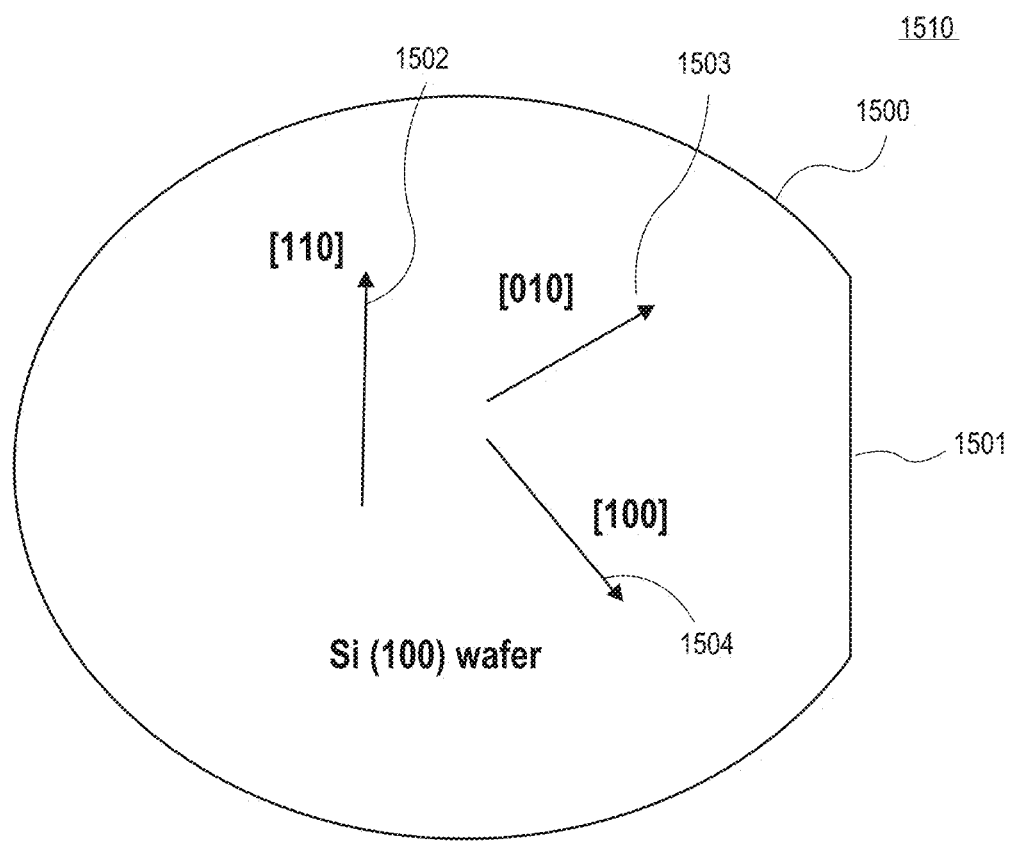
FIG. 15B is a view illustrating examples of silicon mesa structures orientation on a silicon wafer according to one embodiment.

FIG. 15B is a view 1510 illustrating examples of silicon mesa structures orientation on a silicon wafer 1501 according to one embodiment. As shown in FIG. 15B, there are different crystallographical directions on Si (100) wafer 1501, such as directions 1502, 1503, and 1504. Each of the mesa structures can be aligned along one of these directions. In an embodiment, the mesa structure 104 is aligned along <110> crystallographical direction. In an embodiment, the mesa structure 104 is aligned along <100> crystallographical direction. In an embodiment, the mesa structure 104 is aligned along <010> crystallographical direction.

Figure 5:
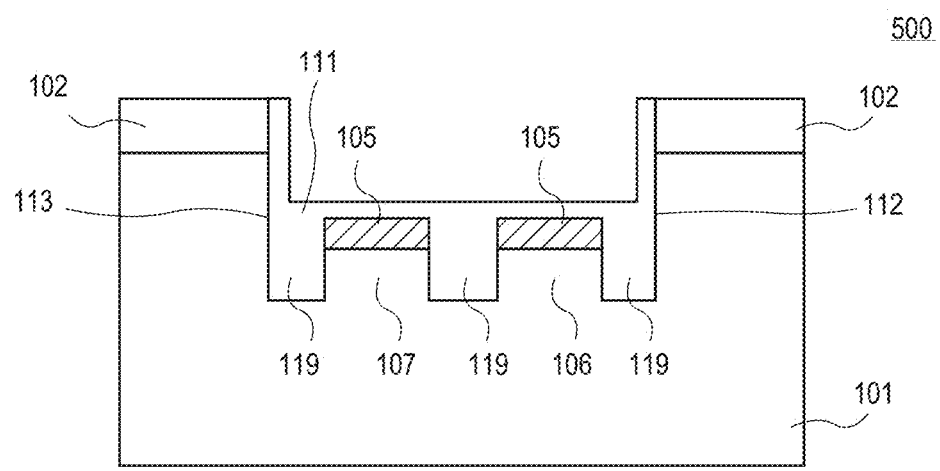
FIG. 5 is a view similar to FIG. 4, after an insulating layer is conformally deposited on patterned hard mask layer on the mesa structures in a trench on a substrate according to one embodiment.

FIG. 5 is a view 500 similar to FIG. 4, after an insulating layer 111 is conformally deposited on patterned hard mask layer 105 on the mesa structures in a trench on a substrate according to one embodiment. The insulating layer 111 fills the space outside the mesa structures and covers the sidewalls of the trench. As shown in FIG. 5, insulating layer fills the space between mesa structures 106 and 107, between the mesa structure 106 and a sidewall 112 of the trench 104, and between the mesa structure 107 and a sidewall 113 of the trench 104. Insulating layer 111 covers sidewall 112 and sidewall 113 of the trench. In an embodiment, insulating layer 111 is a silicon oxide (e.g. $SiO_2$) layer, a silicon nitride layer, aluminum oxide ("$Al_2O_3$"), silicon oxide nitride ("SiON"), other oxide/nitride layer, any combination thereof, or other electrically insulating layer determined by an electronic device design. In an embodiment, the thickness of the insulating layer 111 is from about 100 nm to about 500 nm. In an embodiment, the entire trench 104 is lined by a thin (from about 50 to about 100 nm) oxide or nitride layer. The nitride/oxide layer also fills up the region between the silicon mesas. In one embodiment, insulating layer 111 comprises an interlayer dielectric (ILD), e.g., silicon dioxide. In one embodiment, insulating layer 111 is a low permittivity (low-k) ILD layer. Typically, low-k is referred to the dielectrics having dielectric constant (permittivity k) lower than the permittivity of silicon dioxide.

The insulating layer 111 can be conformally deposited over the mesa structures using any of conformal deposition techniques, such as but not limited to a chemical vapour deposition (CVD), and a physical vapour deposition (PVD), molecular beam epitaxy ("MBE"), metalorganic chemical vapor deposition ("MOCVD"), atomic layer deposition ("ALD"), or other conformal growth technique known to one of ordinary skill in the art of electronic device manufacturing. In an embodiment, insulating layer 111 is conformally deposited over the mesa structures using low temperature CVD processes.

Figure 6:
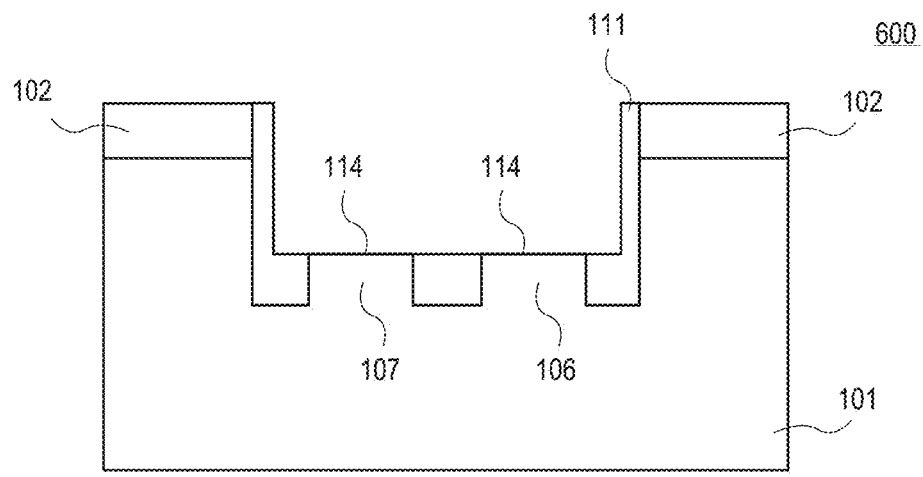
FIG. 6 is a view similar to FIG. 5, after the portions of insulating layer on top hard mask are removed to expose top surfaces of the mesa structures according to one embodiment.

FIG. 6 is a view 600 similar to FIG. 5, after the portions of insulating layer 111 on top hard mask 105 are removed to expose top surfaces 114 of the mesa structures according to one embodiment. In an embodiment, hard mask 105 underneath insulating layer 111 is selectively wet etched to undercut the hard mask layer. Insulating layer 111 is removed by lifting-off the undercut hard mask 105 to expose the top surfaces 114 of the mesa structures. In an embodiment, hard mask 105 is selectively wet etched using an acid based chemistry. As an example, when hard mask 105 is tungsten ("W") and insulating layer 111 is $SiO_2$, then the hard mask of W can be wet etched in a wet etch solution comprising a ratio of 1:2 of $NH_4OH:H_2O_2$ selectively to the $SiO_2$ insulating layer.

Figure 7:
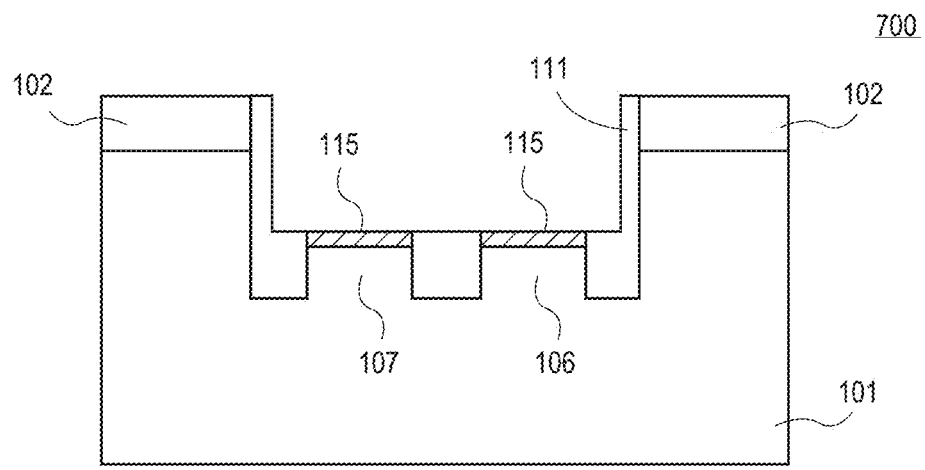
FIG. 7 is a view similar to FIG. 6, after a nucleation layer is deposited on the top surfaces of the mesa structures according to one embodiment.

FIG. 7 is a view 700 similar to FIG. 6, after a nucleation layer is deposited on the top surfaces of the mesa structures according to one embodiment. As shown in FIG. 7, a nucleation layer 115 is selectively deposited onto the top surfaces of the mesa structures 107 and 106. In an embodiment, nucleation layer 115 is an aluminum nitride ("AlN") layer. The nucleation layer 115 can be deposited using one of epitaxial techniques, e.g., chemical vapor deposition ("CVD"), metalorganic chemical vapor deposition ("MOCVD"), atomic layer deposition ("ALD"), molecular beam epitaxy ("MBE"), or other epitaxial growth technique known to one of ordinary skill in the art of electronic device manufacturing.

In an embodiment, the nucleation layer 115 is deposited using a MOCVD technique at a temperature above 1000° C. In an embodiment, the nucleation layer 115 is deposited using a MBE technique at a temperature from about 750° C. to about 800° C. In an embodiment, the nucleation layer of aluminum nitride ("AlN") is deposited onto the top surfaces of the mesa structures to the thickness from about 5 nm to about 200 nm. In an embodiment, nucleation layer 115 of AlN is used to prevent the formation of group III elements and silicon (e.g., GaSi) complexes that can be formed if the III-V material layer is deposited directly onto the silicon. In an embodiment, nucleation layer 115 is used to provide a seed hexagonal crystal structure for the III-V material layer formed on the nucleation layer later on in a process. In an embodiment, nucleation layer 115 is used to capture the interface defects that are formed due to the lattice mismatch between III-V material and silicon.

Figure 8:
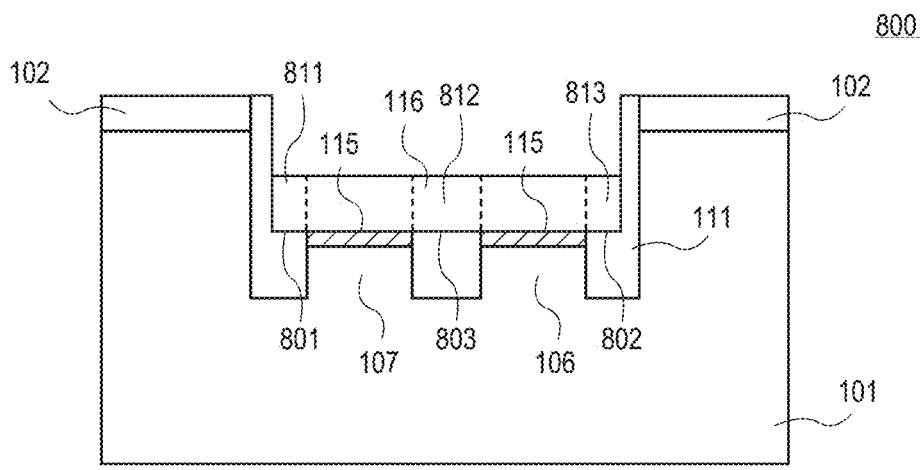
FIG. 8 is a view similar to FIG. 7, after depositing a III-V material layer on the nucleation layer according to one embodiment.

FIG. 8 is a view 800 similar to FIG. 7, after depositing a III-V material layer on the nucleation layer according to one embodiment. A III-V material layer 116 is selectively deposited on nucleation layer 115. The III-V material layer 116 is laterally grown over the portions 801, 802, and 803 of the insulating layer 111 outside the mesa structures 106 and 107, to form LEO portions, such as LEO portions 811, 812, and 813 as shown in FIG. 8.

In an embodiment, III-V material layer 116 is locally grown on nucleation layer 115 using a selective area epitaxy. III-V material layer 116 can be selectively deposited using one of epitaxial techniques known to one of ordinary skill in the art of electronic device manufacturing, e.g., chemical vapor deposition ("CVD"), metallo organic chemical vapor deposition ("MOCVD"), atomic layer deposition ("ALD"), or other epitaxial growth technique known to one of ordinary skill in the art of electronic device manufacturing.

In an embodiment, the III-V material layer 116 is grown vertically on nucleation layer 115 using a MOCVD technique at a temperature in an approximate range of 1000 C-1100° C. In an embodiment, the III-V material layer grown on nucleation layer 115 expands in lateral direction over the insulating layer 111 by modifying at least one of the epitaxial growth parameters, such as a temperature, pressure. In an embodiment, a ratio of the LEO rate to the vertical growth rate of the III-V material layer is at least 5. In an embodiment, the III-V material layer 116 expands in the lateral direction over the insulating layer 111 by increasing the temperature above 1100° C. In an embodiment, the III-V material layer 116 expands in the lateral direction over the insulating layer 111 by decreasing the pressure in the growth chamber down to below 200 Torr, and more specifically, to about 50 Torr. In an embodiment, the III-V material layer 116 expands in the lateral direction over the insulating layer 111 by adding chemical elements (e.g., magnesium ("Mg"), antimony ("Sb"), indium ("In"), or other chemical elements) into the grown chamber reduce the vertical growth rate relative to the lateral growth rate. These chemical elements act as surfactants that attach to the top surface of the silicon mesa structures during the III-V material layer growth thereby reducing the vertical growth rate of the III-V material layer over the silicon mesas. In an embodiment, the gas phase concentration of Mg in the growth chamber during GaN growth is from about 1% to about 5% of total Ga gas phase concentration. In an embodiment, the gas phase concentration of Sb in the growth chamber during GaN growth is from about 0.5% to about 5% of total Ga gas phase concentration. In an embodiment, the gas phase concentration of In in the growth chamber during GaN growth is from about 0.1% to about 5% of total Ga gas phase concentration. In an embodiment, III-V material layer 116 is GaN, InGaN, any other III-N material, any other III-V material, or any combination thereof. In an embodiment, the thickness of the III-V material layer 116 is from about 250 nm to about 2 μm.

In an embodiment, the III-N material layer is nucleated on the exposed surface of the silicon mesa structure, and later with change of growth conditions grows laterally over the oxide/nitride layer. In the nitride material system, threading dislocations normally glide along the [0001] direction with a minimal angle, and hence by using lateral growth a substantially defect free or low defect density GaN film is created. This defect free LEO GaN layer lies on top of the oxide/nitride layer and hence creates a GaN-on-insulator architecture for building GaN transistors. GaN is wideband gap material (3.4 eV) and combined with the underlying insulator can lead to extremely low body leakage currents (order of femto to pico amps/mm) for the transistors, which makes it suitable for RF applications. Although this is a form of epitaxy, which requires the use of underlying buffer layers to reduce defect density and mitigate surface crack formation, the patterning and hence separating the silicon substrate using multiple mesa structures inside the trenches leads to reduction of the total thermal stress buildup in the GaN epi layer. As such, very complicated and thick buffer layers are not required and zero surface cracks and low defect density are obtained with the use of much thinner epi layers.

Figure 9:
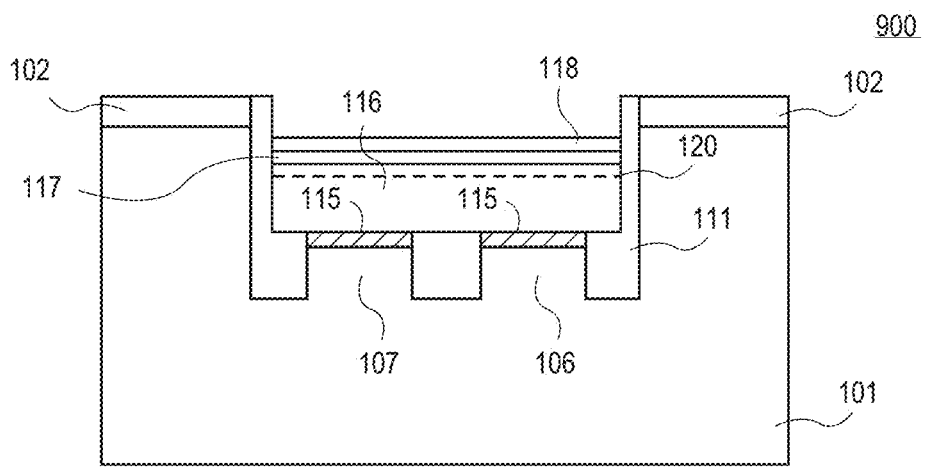
FIG. 9 is a view similar to FIG. 8, after a device layer is deposited over the LEO portions of the III-V material layer according to one embodiment.

FIG. 9 is a view 900 similar to FIG. 8, after a device layer 118 is deposited over the LEO portions of the III-V material layer 116 according to one embodiment. In an embodiment, device layer 118 is deposited on a device layer 117 on III-V material layer 116. In an embodiment, device layer 117 is deposited to enhance mobility in a two-dimensional electron gas ("2DEG") portion 120 of the III-V material layer 116. In an embodiment, device layer 117 is an AlN layer. In an embodiment, the thickness of the device layer 117 is from about 1 nm to about 3 nm.

In an embodiment, device layer 118 includes a III-V material, e.g., AlGaN, AlInN, AlN, any other III-V material, or any combination thereof. In an embodiment, device layer 118 is an $Al_xGa_{1-x}N$ layer, where x is from about 15% to about 40%. In an embodiment, device layer 118 is an $Al_xIn_{1-x}N$ layer, where x is greater than about 85%. In an embodiment, device layer 118 is an AlN layer. The thickness of the device layer 202 determined by a device design. In an embodiment, the thickness of the device layer 202 is from about 2 nm to about 40 nm.

In an embodiment, each of device layers 118 and 117 is deposited using one of epitaxial growth techniques, e.g., chemical vapor deposition ("CVD"), metallo organic chemical vapor deposition ("MOCVD"), atomic layer deposition ("ALD"), MBE, or other epitaxial growth technique known to one of ordinary skill in the art of electronic device manufacturing.

Figure 10:
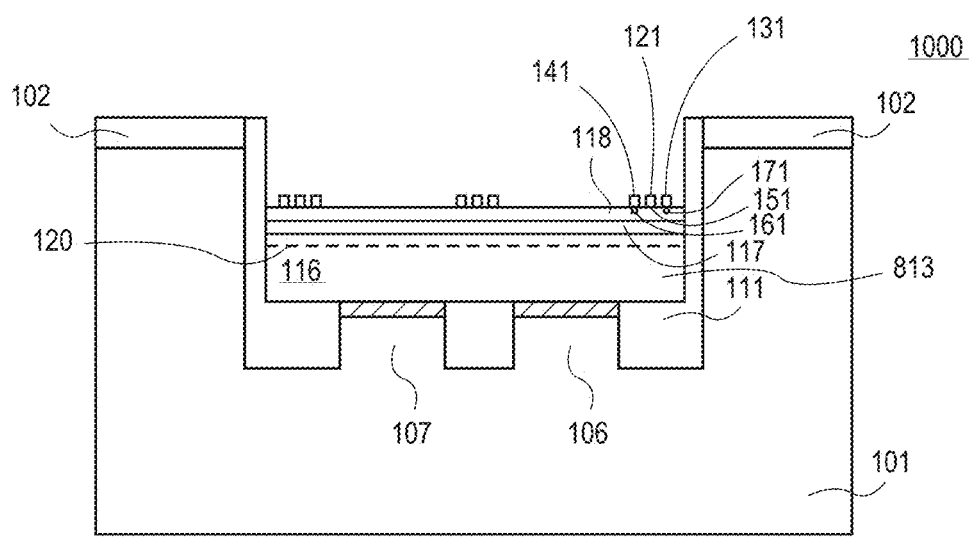
FIG. 10 is a view similar to FIG. 9, after contacts are formed over the portions of device layer over the LEO portions of the III-V material layer to form one or more III-V material based devices according to one embodiment.

FIG. 10 is a view 1000 similar to FIG. 9, after contacts are formed over the portions of device layer 118 over the LEO portions of the III-V material layer 116 to form one or more III-V material based devices according to one embodiment. The III-V material based devices can be, for example, high voltage transistors (e.g., GaN transistors), RF-power amplifiers, power management integrated circuits, or other III-V material based electronic devices. As shown in FIG. 10, device contacts 121, 131, and 141 are formed on the portions of the device layer over the LEO portions of the III-V material layer 116. In an embodiment, device contact 121 is a gate electrode over a gate dielectric 151 on the device layer 118 over the LEO portion 813 of III-V material layer 116. Contact 141 is a source contact on a source region 161, and contact 131 is a drain contact on a drain region 171 of the device layer 118 over the LEO portion of III-V material layer 118. The contacts 121, 131, and 121, gate dielectric 151, drain and source regions 161 and 171 can be formed on the III-V material device layer using techniques known to one of ordinary skill in the art of electronic device manufacturing.

Figure 12:
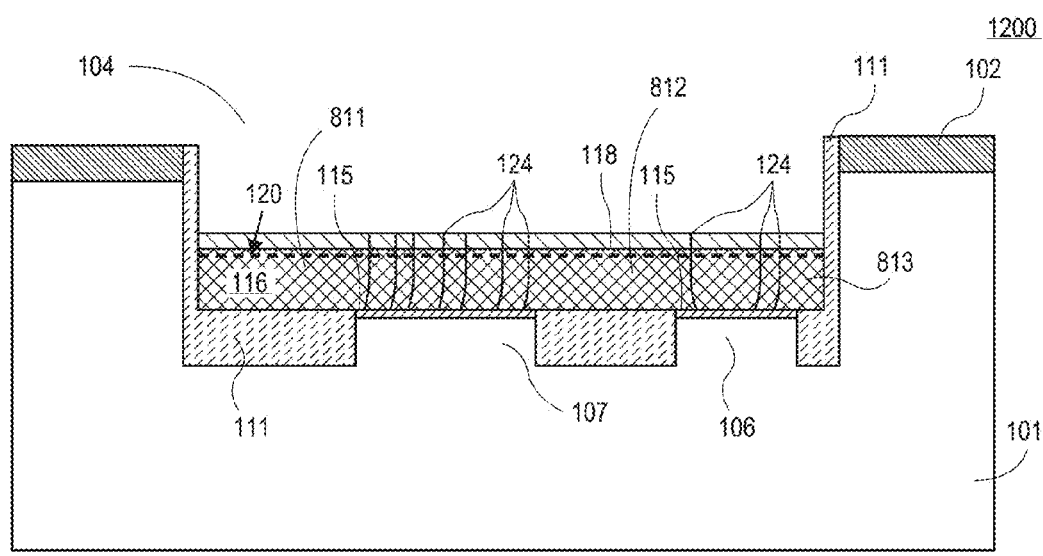
FIG. 12 is a cross-sectional view similar to FIG. 9 that shows treading dislocations generated above mesa structures according to one embodiment.

FIG. 12 is a cross-sectional view 1200 of a structure inside a trench where III-V material based devices can be fabricated similar to FIG. 9 that shows treading dislocations 124 generated above mesa structures according to one embodiment. Treading dislocations 124 propagate across portions of the III-V material layer 116 at about 90 degree angle to the top surface of the mesa structures 106 and 107. There are no threading dislocations across LEO portions 811, 812, and 813. In an embodiment, the LEO portions of the III-V material layer are free of the threading dislocations.

In an embodiment, the device layer is a GaN layer grown inside a redefined trench formed within a parent Si CMOS wafer. This area is called a GaN island and can be used to fabricate a PMIC and RF-PA part of the SoC chip. The trench can be square or rectangular in shape. The trench can be oriented along the <110> direction or at a 45 degree angle to <110> direction. In an embodiment, the depth of the trench is about 2-3 μm. Inside the trench, silicon mesas are created which can be from about 100 nm to about 300 nm tall, as described above.

In an embodiment, the space between the mesas is filled with an oxide/nitride layer and the trench is also lined by that same oxide/nitride layer, as described above. This oxide/nitride layer acts as a liner on the trench sidewalls to prevent the distortion of the adjacent silicon lattice as the GaN layer grows and stops at the liner.

In an embodiment, when GaN grows laterally over this insulating layer a GaN-on-insulator type of an architecture is created, which leads to very low body leakage currents in the transistor, an important requirement for RF applications.

In an embodiment, the III-N material layer epitaxy begins on silicon mesas. The silicon mesa structures are created by patterning silicon within the trench, as described above. These mesas provide a starting nucleation for III-N epitaxy. Patterning the silicon substrate to create the mesa structures leads to reduction of thermal stress in the system and hence does not necessitate the use of complex buffer layers (which exist in the current solutions) to reduce surface cracks and defect density. The orientation of these silicon mesas and their dimensions are used to control both the surface crack density and defect density of GaN within the island.

The device layer 118 is then grown over the entire III-V material layer, as described above. In an embodiment, device layer 118 is a layer which induces the 2DEG by polarization. In an embodiment, the device layer 118 is an alloy, e.g., AlGaN with an underlying AlN thin spacer, or InAlN with an underlying AlN thin spacer. In an embodiment, the thickness of the AlN spacer is about 1 nm and the thickness one of the AlGaN InAlN is in an approximate range of 2-20 nm.

Figure 21A:
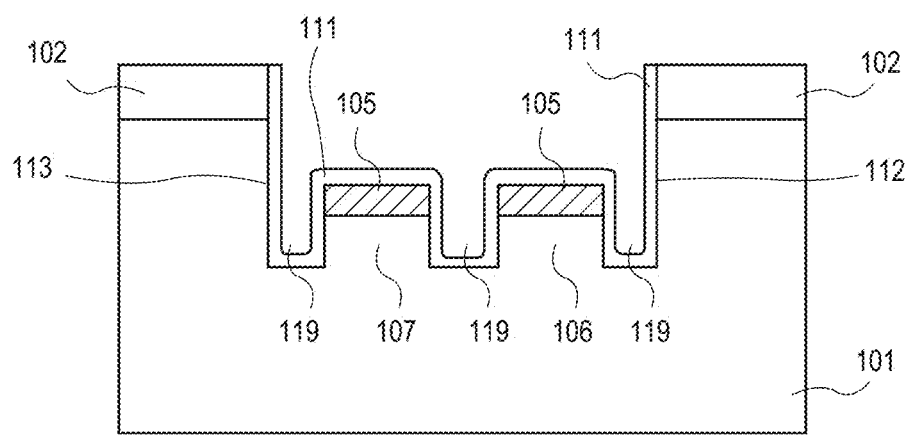
FIG. 21A is a view similar to FIG. 4, after an insulating layer is conformally deposited on the patterned hard mask layer on the mesa structures in a trench on a substrate according to one embodiment.

FIG. 21A is a view 2110 similar to FIG. 4, after an insulating layer 111 is conformally deposited on the patterned hard mask layer 105 on the mesa structures in a trench on a substrate 101 according to one embodiment. The insulating layer 111 covers the sidewalls of the mesa structures and the trench and fills the space outside the mesa structures, as described above with respect to FIG. 5. FIG. 21A differs from FIG. 5 in that the insulating layer 111 is conformally deposited to the thickness that is smaller than the height of the mesa structures 106 and 107.

FIG. 21B is a view 2100 similar to FIG. 21A, after the insulating layer 111 on the hard mask 105 is removed from portions of the mesa structures according to one embodiment. As shown in FIG. 21, the insulating layer 111 is removed from portions of the sidewalls 2103 and 2104 of mesa structure 107 and portions of the sidewalls 2101 and 2102 of mesa structure 106. In an embodiment, hard mask 105 underneath insulating layer 111 is selectively wet etched to undercut the hard mask layer. In an embodiment, hard mask 105 is selectively wet etched using an acid based chemistry, as described above with respect to FIG. 6. In an embodiment, insulating layer 111 is removed by lifting-off the undercut hard mask 105 to expose the top surfaces 114 of the mesa structures and the portions of the sidewalls of the mesa structures 106 and 107. In an embodiment, the insulating layer 111 is removed from the portions of the sidewalls of mesa structures using one of etching techniques known to one of ordinary skill in the art of electronic device manufacturing, such as but not limited to a wet etching, and a dry etching. In an embodiment, insulating layer 111 of silicon oxide is etched using a hydrofluoric acid ("HF") solution.

In an embodiment, the height of the exposed portions of the mesa structures, such as a height 2015 is determined by an electronic device design. In an embodiment, the height of the exposed portions of the mesa structures, such as a height 2015 is at least about 100 nm.

Figure 22:
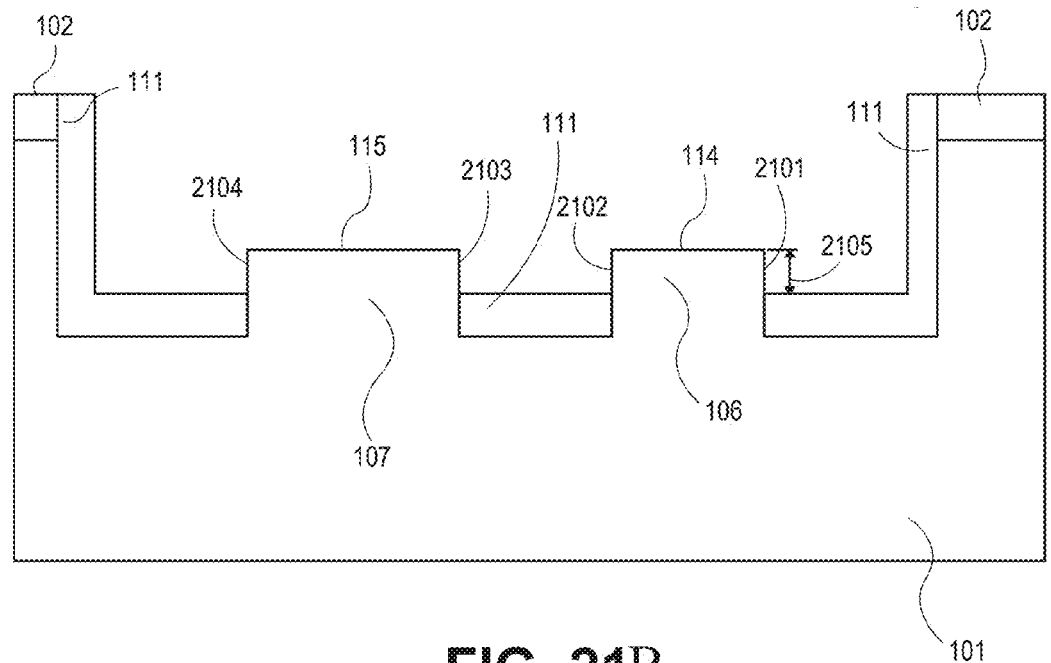
FIG. 22 is a view similar to FIG. 21B, after a nucleation layer is deposited on the top surfaces of the mesa structures according to one embodiment.
Figure 22:
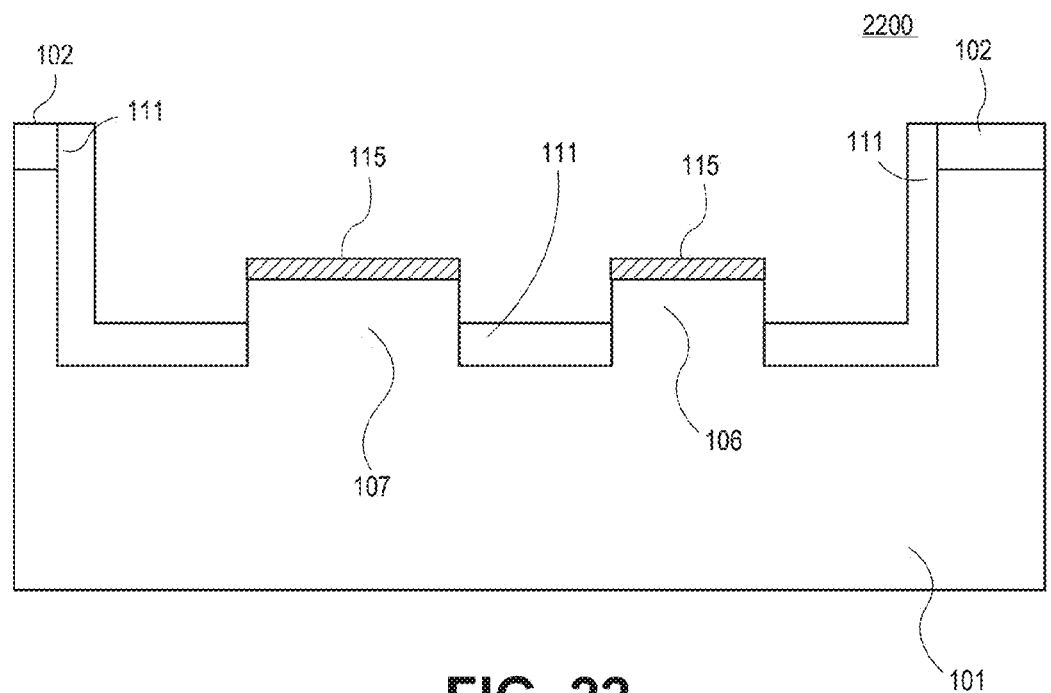

FIG. 22 is a view 2200 similar to FIG. 21B, after a nucleation layer is deposited on the top surfaces of the mesa structures according to one embodiment. As shown in FIG. 22, a nucleation layer 115 is selectively deposited onto the top surfaces of the mesa structures 107 and 106, as described above. In an embodiment, nucleation layer 115 is an aluminum nitride ("AlN") layer. The nucleation layer 115 can be deposited using one of epitaxial techniques, as described above.

Figure 23:
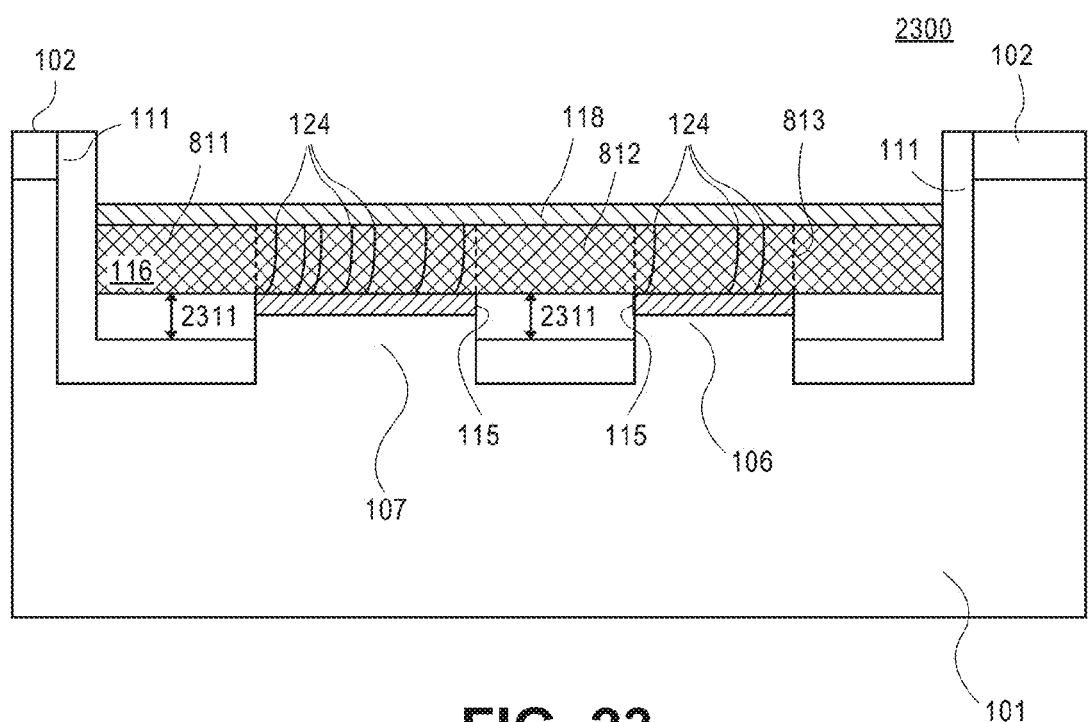
FIG. 23 is a view similar to FIG. 22, after depositing a device layer on a III-V material layer on the nucleation layer according to one embodiment.

FIG. 23 is a view 2300 similar to FIG. 22, after depositing a device layer 118 on a III-V material layer 116 on the nucleation layer 115 according to one embodiment. A III-V material layer 116 is selectively deposited on nucleation layer 115. III-V material layer 116 is laterally grown outside the mesa structures 106 and 107, to form LEO portions, such as LEO portions 811, 812, and 813. As shown in FIG. 23, the LEO portions 811, 812, and 813 are not directly in contact with the insulating 111 layer and are suspended over the mesa structures 106 and 107. As shown in FIG. 23, the LEO portions 811, 812, and 813 are separated from the insulating layer 111 on substrate 101 by a space, such as a space 2311. In an embodiment, insulating layer 111 is removed from the portions of the substrate 101 that are underneath the LEO portions 811, 812, and 813, and the space is created is between the substrate and the LEO portions.

In an embodiment, the space is defined by the height of the exposed portion of the sidewall of the mesa structure and the thickness of the nucleation layer 115. In an embodiment, the space 2311 between the insulating layer and LEO portion is from about 150 nm to about 400 nm.

In an embodiment, III-V material layer 116 is locally grown on nucleation layer 115 using a selective area epitaxy, as described above. In an embodiment, the III-V material layer grown on nucleation layer 115 expands in a lateral direction to be suspended over the insulating layer 111 by modifying at least one of the epitaxial growth parameters, such as a temperature, pressure, as described above. In an embodiment, the III-V material layer 116 expands in the lateral direction to be suspended outside the mesa structures by adding chemical elements into the grown chamber to reduce the vertical growth rate relative to the lateral growth rate, as described above. As shown in FIG. 23, device layer 118 is deposited over III-V material layer 116, as described above. In an embodiment, an enhance mobility layer (not shown) is deposited between the device layer 118 and III-V material layer 116, as described above.

As shown in FIG. 23, treading dislocations 124 propagate across portions of the III-V material layer 116 at about 90 degree angle to the top surface of the mesa structures 106 and 107. There are no threading dislocations across LEO portions 811, 812, and 813. In an embodiment, the LEO portions of the III-V material layer are free of the threading dislocations. In an embodiment, lateral growth of the wide-band gap III-V material outside the mesa structures which is separated from the underlying insulator by a space can lead to even lower body leakage currents than in the structure depicted in FIG. 9.

Figure 13:
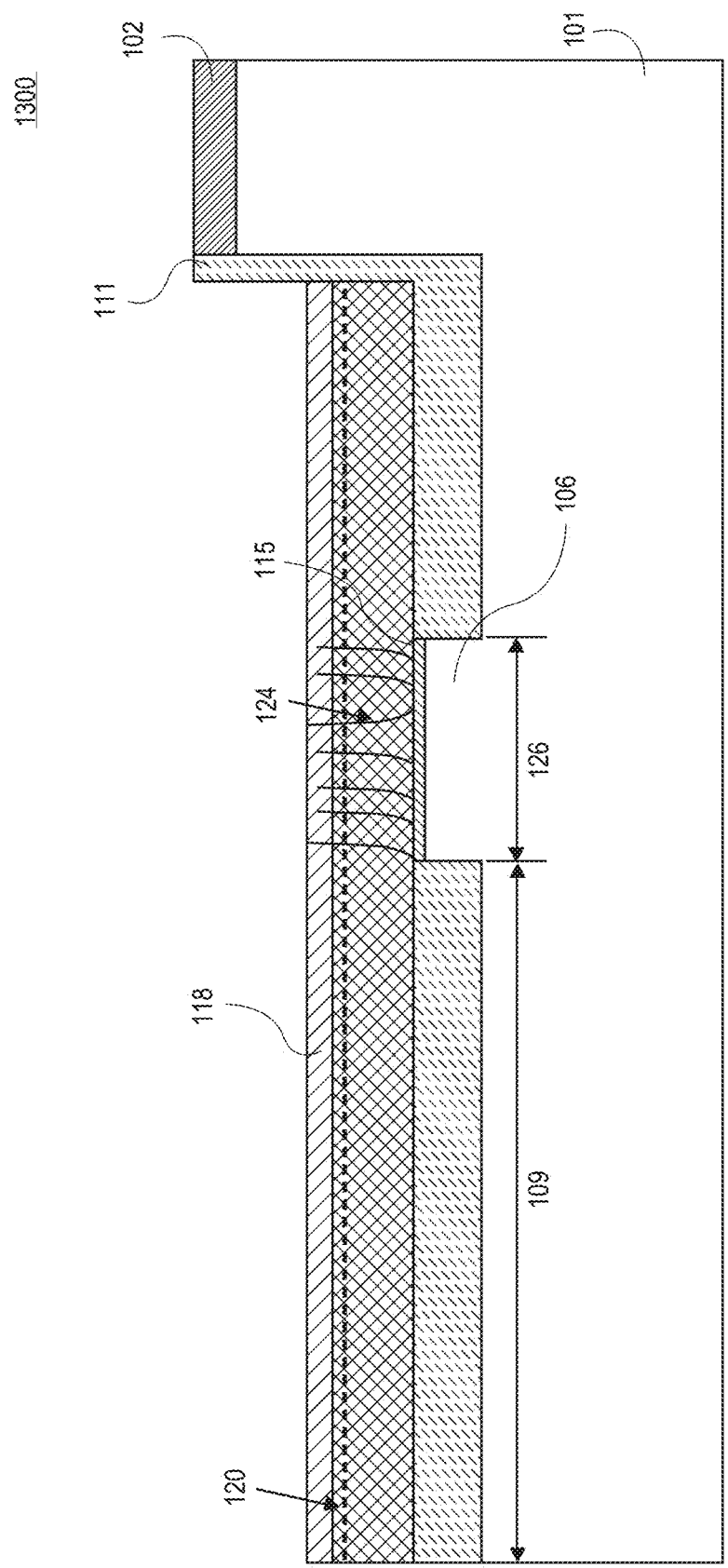
FIG. 13 is a cross-sectional view of a portion of a structure shown in FIG. 12 to demonstrate dependence of the defect density from the size of the mesa structure according to one embodiment.

FIG. 13 is a cross-sectional view 1300 of a portion of a structure shown in FIG. 12 to demonstrate dependence of the defect density from the size of the mesa structure according to one embodiment. Mesa structure 106 has a width 126. The mesa structure 106 is separated from another mesa structure (not shown) by distance 109. In an embodiment, as GaN laterally grows on the oxide layer, it results in low defect density GaN films. This is because of the nature of dislocation defects in nitrides, which prefer to thread up almost vertically (along the 0001 direction) and hence do not appear for laterally overgrown GaN on oxide. This approach thus leads to an overall reduction in the defect density of GaN epi films on Si (100). In an embodiment, the total defect density of the III-V material layer 116 depends on the ratio of the size of the mesa structure (width 126) and distance 109. In an embodiment, the distance 109 is about 100 μm, width 126 is about 2 μm provides defect density in the LEO region of the GaN about $10^7$ $cm^{-2}$, and defect density above in the region of the GaN layer above the mesa structure about $10^9$ $cm^{-2}$. Hence, the average defect density in the GaN layer is from about $10^7$ $cm^{-2}$ to about $2 \times 10^7$ $cm^{-2}$.

FIG. 14 is a cross-sectional view 1400 of a portion of a structure shown in FIG. 12 to demonstrate advantages of depositing the LEO portions of the III-V material layer 116 on the insulating layer 111 according to one embodiment. As shown in FIG. 14, the insulating layer 111 (e.g., oxide/nitride) acts a liner to prevent III-V material (e.g., GaN) from direct contact with adjacent sidewall 112 of silicon substrate 102 that can prevent damage of the silicon substrate 102.

The insulating layer (e.g., oxide/nitride) layer formed between the silicon mesas provides at least two advantages: a) the insulating layer reduces the body leakage current in the GaN transistor from what it would have been if the GaN transistor were formed on Si. That is, the insulating layer 111 provides a III-V material-on-insulator approach similar to silicon-on-insulator approach used in RF applications. b) the insulating layer enables laterally epitaxial overgrowth of the III-V material. This is further explained with respect to FIG. 15A.

FIG. 15A is a cross-sectional view 1500 of a portion of a structure shown in FIG. 14 to demonstrate lateral overgrowth of the III-V material layer according to one embodiment. In an embodiment, when III-V material layer 116 (e.g., GaN) grows over the insulating layer 111 (e.g., silicon oxide), the {1-100} facets 129 grow out fast and are called lateral overgrowth as opposed to vertical growth where the {0001} planes 128 are grown. Due to the nature of the dislocations in nitrides, the threading disclocation defects 124 are not present in the LEO GaN region and hence are effectively "trapped" within the region above the silicon mesas. Thus, the LEO GaN films have substantially low defects density and are substantially defect free, whereas the GaN layer which grows above the mesa structures has threading disclocations 124 and defect density from about $1 \times 10^9$ cm$^{-2}$ to about $8 \times 10^9$ cm$^{-2}$.

Figure 16:
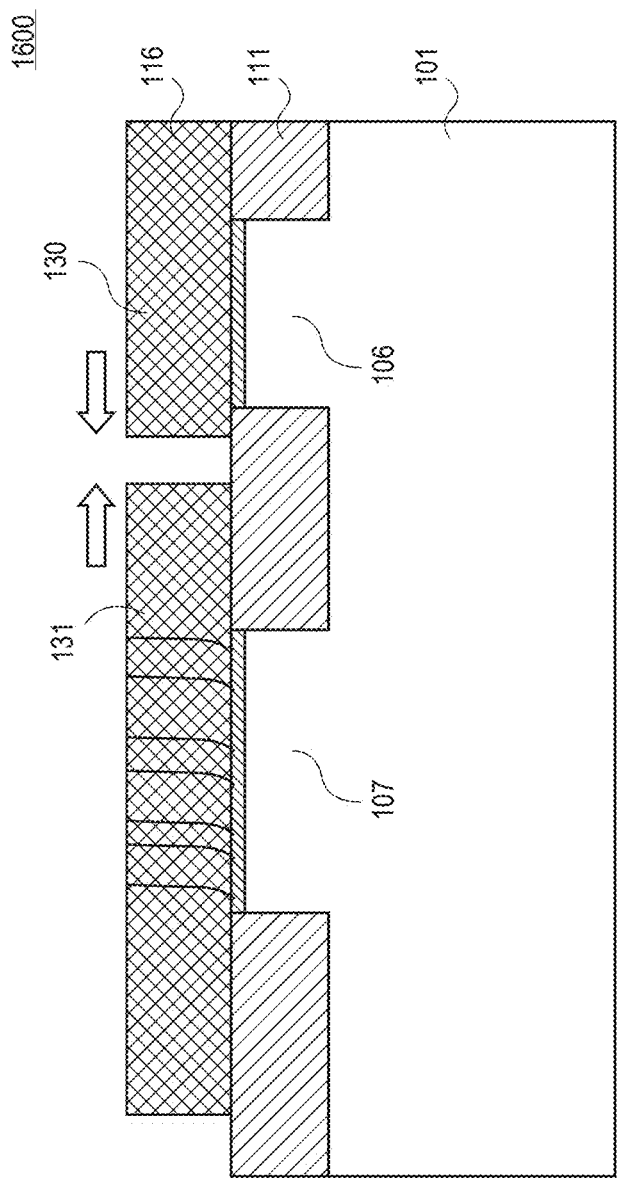
FIG. 16 is a cross-sectional view similar to FIG. 12 to demonstrate two approaching LEO portions of the III-V material layer according to one embodiment.

FIG. 16 is a cross-sectional view 1600 similar to FIG. 12 to demonstrate two approaching LEO portions of the III-V material layer according to one embodiment. In an embodiment, patterning of the silicon substrate 101 into mesa structures 106 and 107 provide the following advantages:

a) The orientation, size, and shape of the silicon mesa structure are used to enable lateral epitaxial overgrowth of III-V material layer 116 (e.g., GaN) and the growth rates of the lateral facets of III-V material layer 116. The orientation, size, and shape of the silicon mesa structure are also important for seamless merging of two portions 130 and 131 of III-V material layer 116, approaching each other because of the LEO growth. The orientation of the silicon mesas 106 and 107 determines if the III-V material (e.g., GaN) facets of the portions 130 and 131 which overgrow on the insulating layer 111 (e.g., SiO$_2$) would have substantially vertical planes for seamless merging.

Due to the patterning of the silicon mesas the net thermal stress mismatch between the III-V material layer 116 (e.g., GaN) and silicon substrate 101 is partitioned and reduced as compared to the thermal stress developed for a GaN film grown on a continuous Si substrate. This is beneficial as the tensile stress developed in the GaN film on Si during cool down post epitaxy can be huge (about GPa) that leads to surface crack formation in the GaN epitaxial layer. To alleviate this, typically complex buffer layer stacks are used (current solutions) to counter balance this tensile stress. By reducing this thermal stress by patterning the Si substrate into the mesa structures, the need for this complex buffer layer stacks is removed. As such, the total buffer layer thickness can be almost halved while maintaining the same defect density and substantially zero surface crack density.

Figure 17A:
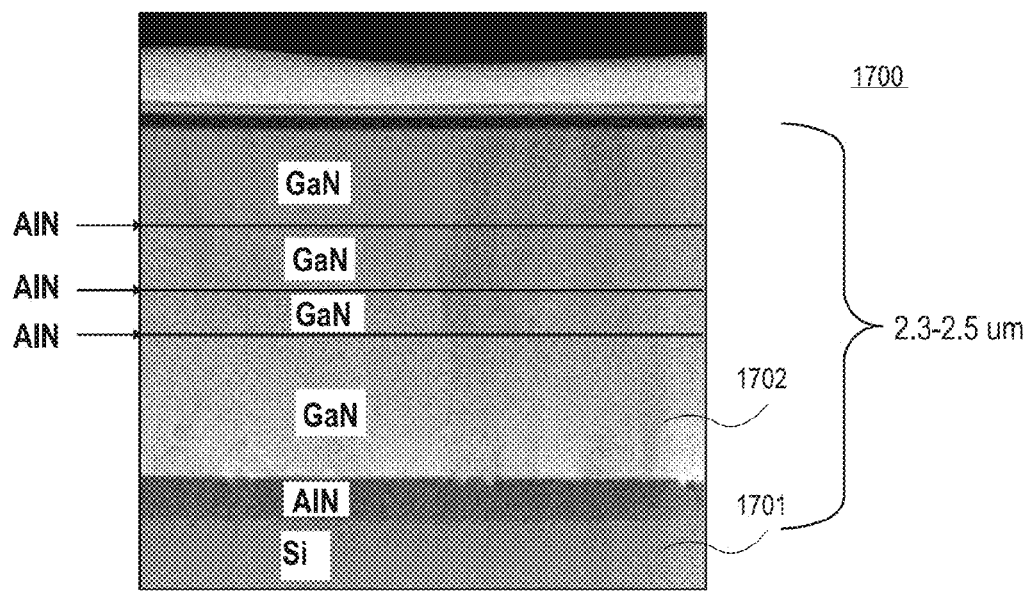
FIG. 17A shows a cross-sectional view of a III-V material buffer layer stack grown on a planar silicon substrate according to one embodiment.

FIG. 17A shows a cross-sectional view 1700 of a III-V material buffer layer stack grown on a planar silicon substrate according to one embodiment. As shown in FIG. 17A, a thick III-V material stack 1702 grown on a planar silicon substrate 1701 contains multiple AlN/GaN layers (e.g., AlN/GaN/AlN/GaN/AlN/GaN/AlN/GaN/AlN). Typically, the thickness of the III-V material stack 1702 is greater than about 2.5 microns.

Figure 17B:
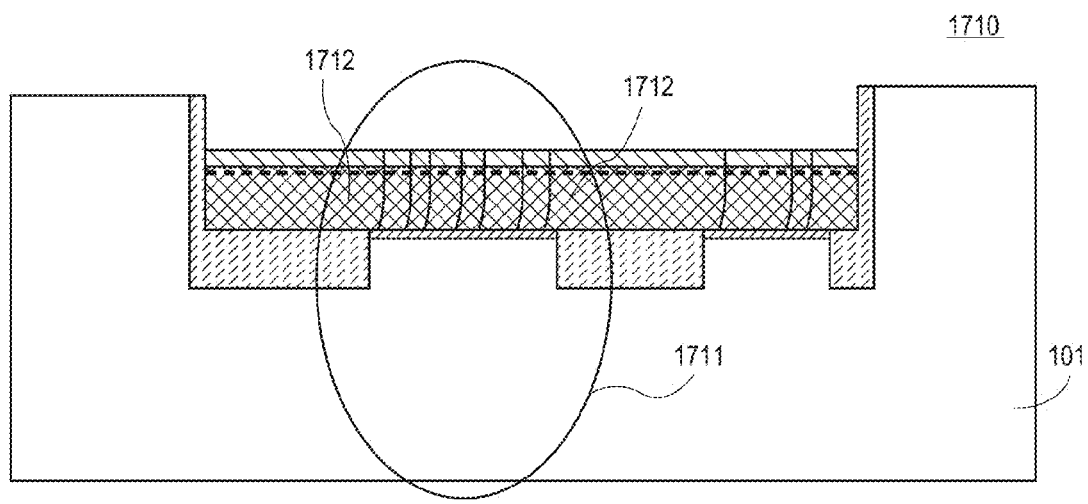
FIG. 17B shows a cross-sectional view similar to FIG. 12 to demonstrate growth of the GaN on Si mesas with the reduced buffer thickness comparing to the structure shown in FIG. 17A according to one embodiment.
Figure 17C:
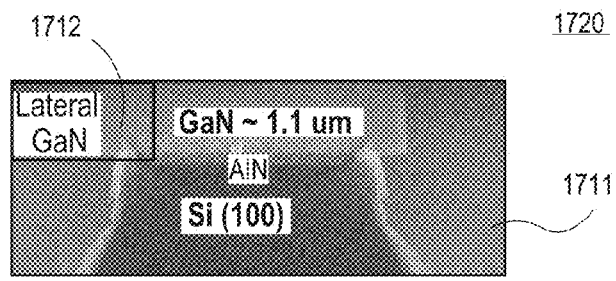
FIG. 17C is an atomic force microscope view of a portion of the structure depicted in FIG. 17B.

FIG. 17B shows a cross-sectional view 1710 similar to FIG. 12 to demonstrate growth of the GaN on Si mesas with reduced buffer thickness comparing to the structure shown in FIG. 17A according to one embodiment. As shown in FIG. 17B, LEO portions 1712 of the GaN layer are produced over the SiO2 insulating layer outside the mesa structures. The LEO portions 1712 are substantially free of surface cracks, as shown in FIG. 17B. FIG. 17C is an atomic force microscope ("AFM") view 1720 of a portion 1711 of the structure depicted in FIG. 17B. As shown in FIG. 17C, the portion 1711 has LEO portion 1712 with vertical planes for seamless merging with other LEO portions. The AFM view shows high quality GaN grown by lateral overgrowth and seamless merging of the LEO regions. The AFM view also shows very smooth surface and controlled GaN overgrowth. The GaN buffer thickness is reduced comparing to the thickness of the GaN buffer stack grown on planar substrate 1701 depicted in FIG. 17A. In an embodiment, the GaN buffer thickness is about 1.1 microns.

Figure 18A:
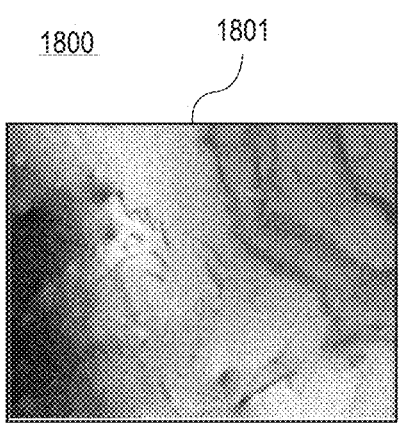
FIG. 18A is a top view showing a III-V material stack structure grown on a planar substrate according to one embodiment.
Figure 18B:
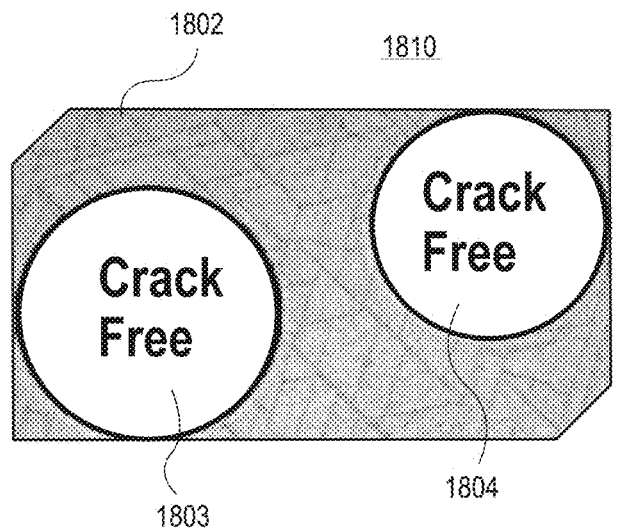
FIG. 18B is a top view showing a III-V material stack structure grown on mesa structures according to one embodiment.

FIG. 18A is a top view 1800 showing a III-V material stack structure grown on a planar substrate 1801 according to one embodiment. This structure has defect density of about $4 \times 10^9$ cm$^{-2}$. FIG. 18B is a top view 1802 showing a III-V material stack structure grown on mesa structures according to one embodiment. This structure has crack free regions 1803 and 1804. As shown in FIG. 18B, by laterally overgrowing GaN material using the silicon mesas, crack free regions are created, and thinner GaN stacks are formed.

Figure 18C:
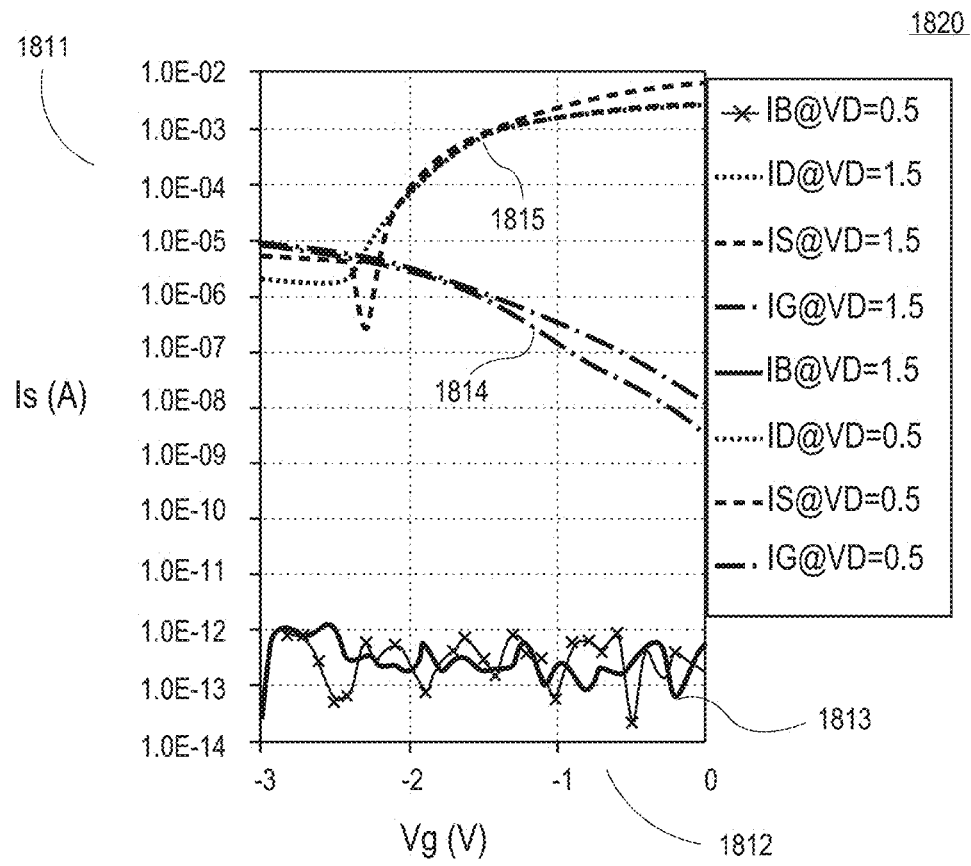
FIG. 18C is a graph showing a current versus a voltage curves for a GaN transistor grown using silicon mesas according to one embodiment.

FIG. 18C is a graph 1820 showing a current 1801 versus a voltage 1812 curves for a GaN transistor grown using silicon mesas according to one embodiment. Graph 1820 illustrates a body leakage current curve 1813, a gate current curve 1814, and a source current curve 1815. As shown in FIG. 18C, a body leakage current 1813 of the GaN transistor grown using silicon mesas is very low (e.g., less than $1 \times 10^{-12}$ A).

Figure 19A:
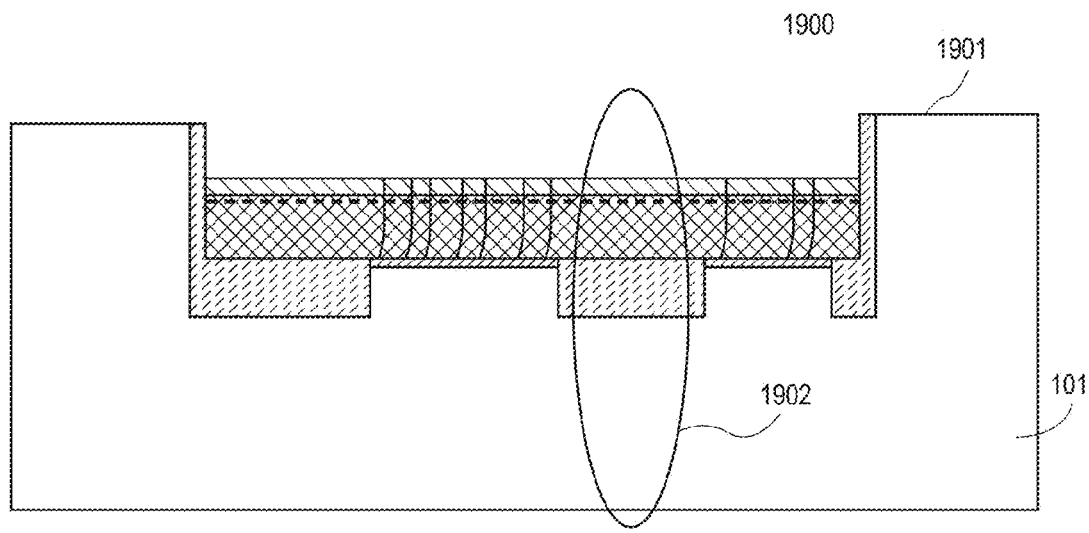
FIG. 19A shows a cross-sectional view 1901 similar to FIG. 12 to demonstrate seamless merging of the LEO portions of the III-V material layer according to one embodiment.
Figure 19B:
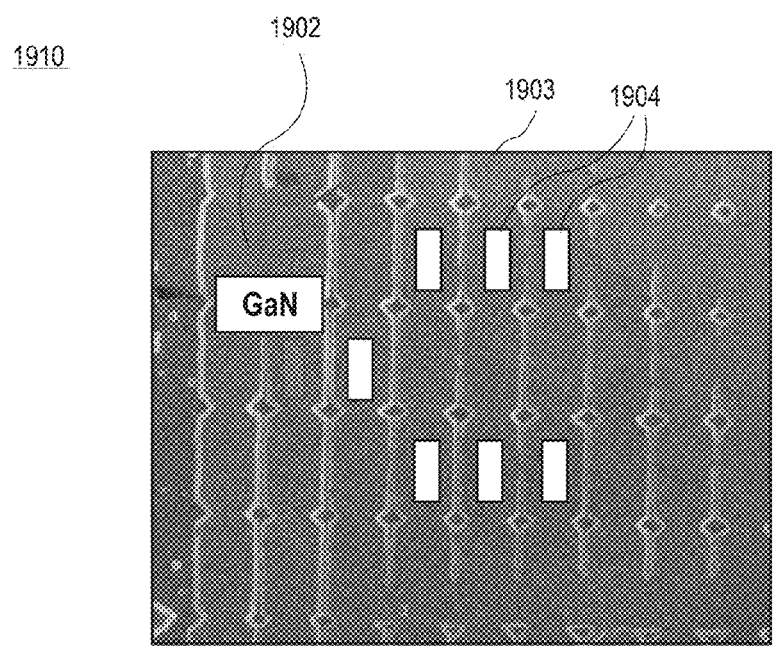
FIG. 19B is a top view of the portion made by a scanning electron microscope ("SEM").
Figure 19C:
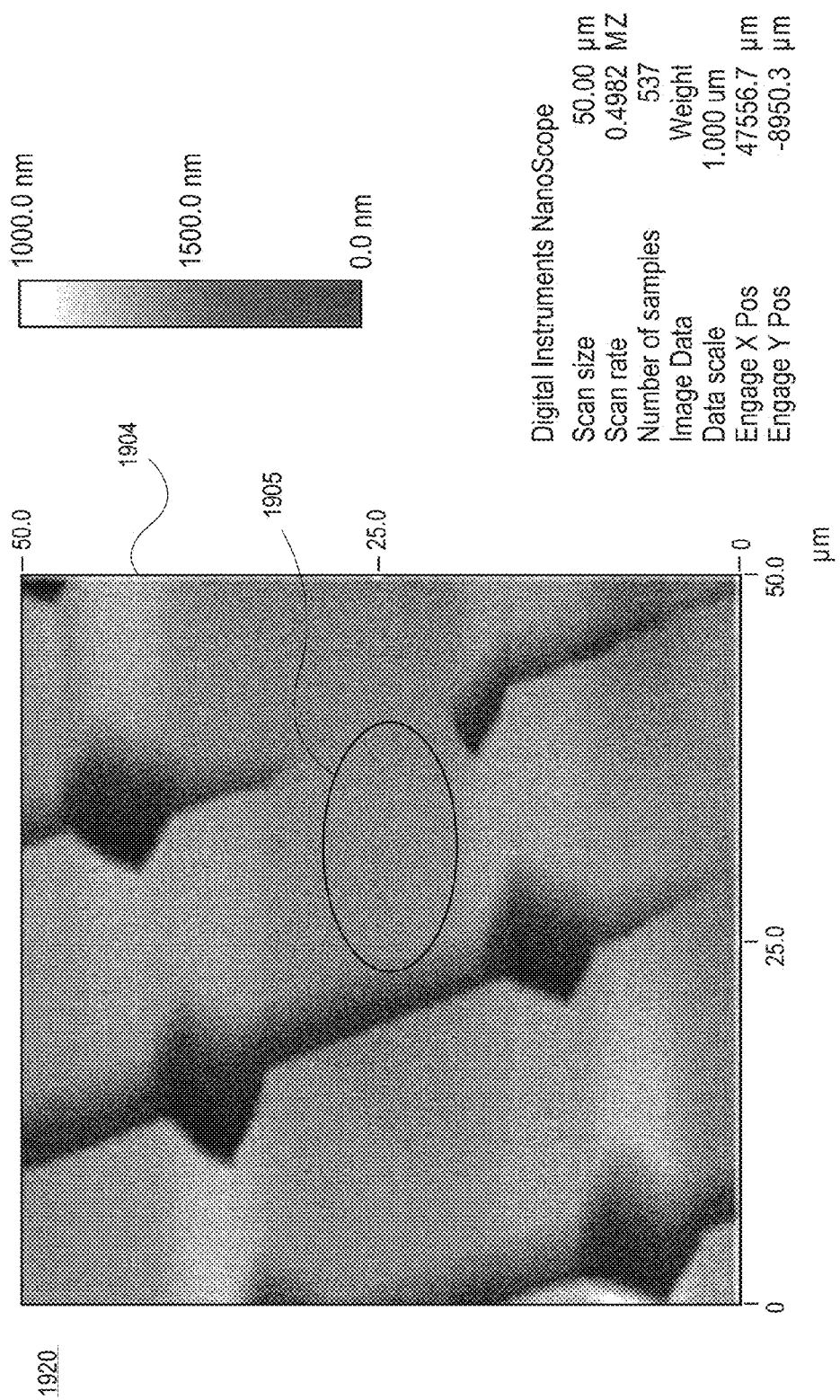
FIG. 19C is an atomic force microscope image of a top view of the structure having the portions of the GaN material laterally grown over an insulating layer between silicon mesas according to one embodiment.

FIG. 19A shows a cross-sectional view 1901 similar to FIG. 12 to demonstrate seamless merging of the LEO portions of the III-V material layer according to one embodiment. As shown in FIG. 19A, a portion 1902 of the structure includes an LEO portion of the GaN layer formed over the SiO$_2$ layer between the mesa structures. FIG. 19B is a top view 1903 of the portion 1902 made by a scanning electron microscope ("SEM"). The SEM view shows the laterally overgrown GaN 1902 with seamless merging. The squares 1904 show the windows from where GaN grows out. FIG. 19C is an atomic force microscope ("AFM") image 1904 of a top view 1920 of the structure having the portions of the GaN material laterally grown over an insulating layer between silicon mesas according to one embodiment. As shown in FIG. 19C, two LEO portions of GaN material formed between two mesas are seamlessly merged into a single portion 1905.

Figure 20:
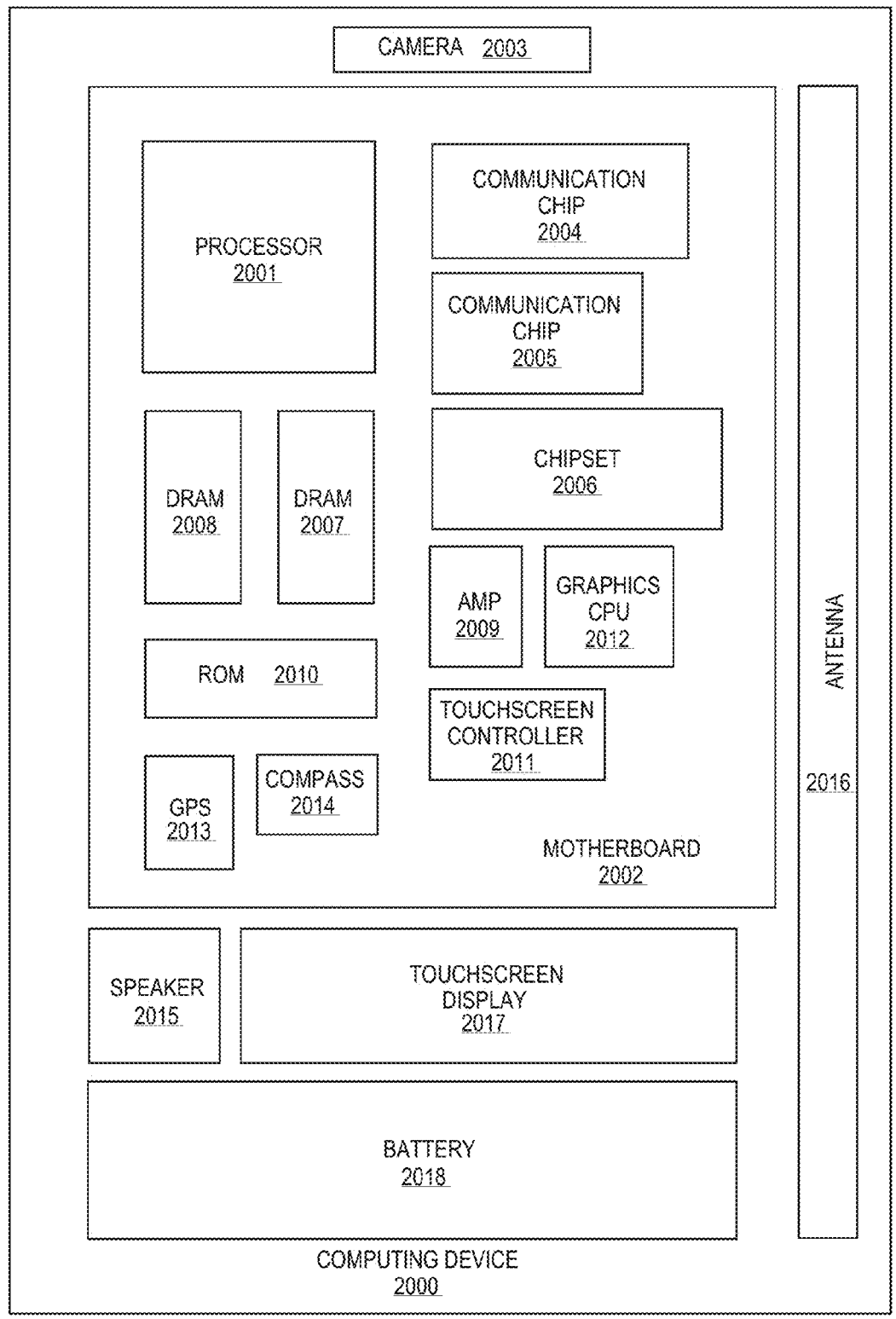
FIG. 20 illustrates a computing device in accordance with one embodiment.

FIG. 20 illustrates a computing device 2000 in accordance with one embodiment. The computing device 2000 houses a board 2002. The board 2002 may include a number of components, including but not limited to a processor 2001 and at least one communication chip 2004. The processor 2001 is physically and electrically coupled to the board 2002. In some implementations at least one communication chip is also physically and electrically coupled to the board 2002. In further implementations, at least one communication chip 2004 is part of the processor 2001.

Depending on its application, computing device 2000 may include other components that may or may not be physically and electrically coupled to the board 2002. These other components include, but are not limited to, a memory, such as a volatile memory 2008 (e.g., a DRAM), a non-volatile memory 2010 (e.g., ROM), a flash memory, a graphics processor 2012, a digital signal processor (not shown), a crypto processor (not shown), a chipset 2006, an antenna 2016, a display, e.g., a touchscreen display 2017, a display controller, e.g., a touchscreen controller 2011, a battery 2018, an audio codec (not shown), a video codec (not shown), an amplifier, e.g., a power amplifier 2009, a global positioning system (GPS) device 2013, a compass 2014, an accelerometer (not shown), a gyroscope (not shown), a speaker 2015, a camera 2003, and a mass storage device (such as hard disk drive, compact disk (CD), digital versatile disk (DVD), and so forth) (not shown).

A communication chip, e.g., communication chip 2004, enables wireless communications for the transfer of data to and from the computing device 2000. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 2004 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 2000 may include a plurality of communication chips. For instance, a communication chip 2004 may be dedicated to shorter range wireless communications such as Wi-Fi and Bluetooth and a communication chip 2036 may be dedicated to longer range wireless communications such as GPS, EDGE, GPRS, CDMA, WiMAX, LTE, Ev-DO, and others.

In at least some embodiments, the processor 2001 of the computing device 2000 includes an integrated circuit die having III-V devices co-integrated with Si CMoS devices on a silicon wafer as described herein. The integrated circuit die of the processor includes one or more devices, such as transistors or metal interconnects as described herein. The term "processor" may refer to any device or portion of a device that processes electronic data from registers and/or memory to transform that electronic data into other electronic data that may be stored in registers and/or memory. The communication chip 2005 also includes an integrated circuit die having III-V devices co-integrated with Si CMoS devices on a silicon wafer according to the embodiments described herein.

In further implementations, another component housed within the computing device 2000 may contain an integrated circuit die having III-V devices co-integrated with Si CMoS devices on a silicon wafer according to embodiments described herein.

In accordance with one implementation, the integrated circuit die of the communication chip includes one or more devices, such as transistors and metal interconnects, as described herein. In various implementations, the computing device 2000 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 2000 may be any other electronic device that processes data.

The following examples pertain to further embodiments:

A method to manufacture an electronic device comprising conformally depositing an insulating layer on a plurality of mesa structures in a trench on a substrate to fill a space outside the mesa structures; depositing a nucleation layer on the mesa structures; and depositing a III-V material layer on the nucleation layer, wherein the III-V material layer is laterally grown over the insulating layer.

A method to manufacture an electronic device comprising depositing an insulating layer on a plurality of mesa structures in a trench on a substrate, the insulating layer filling a space outside the mesa structures; depositing a nucleation layer on the mesa structures; depositing a III-V material layer on the nucleation layer, wherein the III-V material layer is laterally grown over the insulating layer; and depositing a device layer on the laterally grown III-V material layer.

A method to manufacture an electronic device comprising depositing an insulating layer on a plurality of mesa structures in a trench on a substrate, the insulating layer filling a space outside the mesa structures; depositing a nucleation layer on the mesa structures; and depositing a III-V material layer on the nucleation layer, wherein the III-V material layer is laterally grown over the insulating layer, and wherein the III-V material layer includes GaN, and the substrate includes silicon.

A method to manufacture an electronic device comprising depositing an insulating layer on a plurality of mesa structures in a trench on a substrate, the insulating layer filling a space outside the mesa structures; depositing a nucleation layer on the mesa structures; and depositing a III-V material layer on the nucleation layer, wherein the III-V material layer is laterally grown over the insulating layer, wherein the insulating layer includes silicon oxide, silicon nitride, or a combination thereof.

A method to manufacture an electronic device comprising depositing an insulating layer on a plurality of mesa structures in a trench on a substrate, the insulating layer filling a space outside the mesa structures; depositing a nucleation layer on the mesa structures; and depositing a III-V material layer on the nucleation layer, wherein the III-V material layer is laterally grown over the insulating layer, wherein the nucleation layer includes AlN.

A method to manufacture an electronic device comprising depositing an insulating layer on the substrate; patterning the insulating layer on the substrate; etching the substrate through the patterned insulating layer to form a trench; depositing an insulating layer on a plurality of mesa structures within the trench on the substrate filling a space outside the mesa structures; depositing a nucleation layer on the mesa structures; and depositing a III-V material layer on the nucleation layer, wherein the III-V material layer is laterally grown over the insulating layer outside the mesa structures.

A method to manufacture an electronic device comprising depositing a hard mask layer in a trench on a substrate; patterning the hard mask layer; etching the substrate through the patterned hard mask layer to form a plurality of mesa structures; removing the hard mask layer; depositing an insulating layer on the plurality of mesa structures within the trench on the substrate, the insulating layer filling a space outside the mesa structures; depositing a nucleation layer on the mesa structures; and depositing a III-V material layer on the nucleation layer, wherein the III-V material layer is laterally grown over the insulating layer outside the mesa structures.

A method to manufacture an electronic device comprising depositing an insulating layer on a plurality of mesa structures in a trench on a substrate, the insulating layer filling a space outside the mesa structures; depositing a nucleation layer on the mesa structures; and depositing a III-V material layer on the nucleation layer, wherein the III-V material layer is laterally grown over the insulating layer, wherein the distance between the mesa structures is determined by the lateral overgrowth rate of the III-V material layer.

A method to manufacture an electronic device comprising depositing an insulating layer on a plurality of mesa structures in a trench on a substrate, the insulating layer filling a space outside the mesa structures; depositing a nucleation layer on the mesa structures; and depositing a III-V material layer on the nucleation layer, wherein the III-V material layer is laterally grown over the insulating layer, and wherein the insulating layer covers a sidewall of the trench.

A method to manufacture an electronic device comprising depositing an insulating layer on a plurality of mesa structures in a trench on a substrate, the insulating layer filling a space outside the mesa structures; depositing a nucleation layer on the mesa structures; and depositing a III-V material layer on the nucleation layer, wherein the III-V material layer is laterally grown over the insulating layer, and wherein the III-V material layer grows faster over the insulating layer than over the nucleation layer.

A method to manufacture an electronic device comprising depositing an insulating layer on a plurality of mesa structures in a trench on a substrate, the insulating layer filling a space outside the mesa structures; depositing a nucleation layer on the mesa structures; and depositing a III-V material layer on the nucleation layer, wherein the III-V material layer is laterally grown over the insulating layer, and wherein at least one of the mesa structures has a square shape; rectangular shape, or a polygon shape.

A method to manufacture an electronic device comprising depositing an insulating layer on a plurality of mesa structures in a trench on a substrate, the insulating layer filling a space outside the mesa structures; depositing a nucleation layer on the mesa structures; and depositing a III-V material layer on the nucleation layer, wherein the III-V material layer is laterally grown over the insulating layer, and wherein the size of at least one of the mesa structures is from 2 microns to 10 microns.

A method to manufacture an electronic device comprising depositing an insulating layer on a plurality of mesa structures in a trench on a substrate, the insulating layer filling a space outside the mesa structures; depositing a nucleation layer on the mesa structures; and depositing a III-V material layer on the nucleation layer, wherein the III-V material layer is laterally grown over the insulating layer, and wherein the laterally grown III-V material layer is separated from the insulating layer by a space.

An apparatus to manufacture an electronic device comprising an insulating layer on a plurality of mesa structures in a trench on the substrate, the insulating layer filling a space outside the mesa structures; a nucleation layer on the mesa structures; and a III-V material layer on the nucleation layer, wherein the III-V material layer is laterally grown over the first insulating layer.

An apparatus to manufacture an electronic device comprising an insulating layer on a plurality of mesa structures in a trench on the substrate, the insulating layer filling a space outside the mesa structures; a nucleation layer on the mesa structures; and a III-V material layer on the nucleation layer, wherein the III-V material layer is laterally grown over the first insulating layer; and a device layer on the laterally grown III-V material layer.

An apparatus to manufacture an electronic device comprising an insulating layer on a plurality of mesa structures in a trench on the substrate, the insulating layer filling a space outside the mesa structures; a nucleation layer on the mesa structures; and a III-V material layer on the nucleation layer, wherein the III-V material layer is laterally grown over the first insulating layer, and wherein the III-V material layer includes GaN, and the substrate includes silicon.

An apparatus to manufacture an electronic device comprising an insulating layer on a plurality of mesa structures in a trench on the substrate, the insulating layer filling a space outside the mesa structures; a nucleation layer on the mesa structures; and a III-V material layer on the nucleation layer, wherein the III-V material layer is laterally grown over the first insulating layer, an wherein the insulating layer includes silicon oxide, silicon nitride, or a combination thereof.

An apparatus to manufacture an electronic device comprising an insulating layer on a plurality of mesa structures in a trench on the substrate, the insulating layer filling a space outside the mesa structures; a nucleation layer on the mesa structures; and a III-V material layer on the nucleation layer, wherein the III-V material layer is laterally grown over the first insulating layer, and wherein the nucleation layer includes AlN.

An apparatus to manufacture an electronic device comprising an insulating layer on a plurality of mesa structures in a trench on the substrate, the insulating layer filling a space outside the mesa structures; a nucleation layer on the mesa structures; and a III-V material layer on the nucleation layer, wherein the III-V material layer is laterally grown over the first insulating layer, and wherein the distance between the mesa structures is determined by the lateral overgrowth rate of the III-V material layer.

An apparatus to manufacture an electronic device comprising an insulating layer on a plurality of mesa structures in a trench on the substrate, the insulating layer filling a space outside the mesa structures; a nucleation layer on the mesa structures; and a III-V material layer on the nucleation layer, wherein the III-V material layer is laterally grown over the first insulating layer, and wherein the insulating layer covers a sidewall of the trench.

An apparatus to manufacture an electronic device comprising an insulating layer on a plurality of mesa structures in a trench on the substrate, the insulating layer filling a space outside the mesa structures; a nucleation layer on the mesa structures; and a III-V material layer on the nucleation layer, wherein the III-V material layer is laterally grown over the first insulating layer, and wherein at least one of the mesa structures is aligned along {0001} crystal orientation.

An apparatus to manufacture an electronic device comprising an insulating layer on a plurality of mesa structures in a trench on the substrate, the insulating layer filling a space outside the mesa structures; a nucleation layer on the mesa structures; and a III-V material layer on the nucleation layer, wherein the III-V material layer is laterally grown over the first insulating layer, and wherein at least one of the mesa structures has a square shape; rectangular shape, or a polygon shape.

An apparatus to manufacture an electronic device comprising an insulating layer on a plurality of mesa structures in a trench on the substrate, the insulating layer filling a space outside the mesa structures; a nucleation layer on the mesa structures; and a III-V material layer on the nucleation layer, wherein the III-V material layer is laterally grown over the first insulating layer, and wherein the width of at least one of the mesa structures is from 2 microns to 10 microns and wherein the height of at least one of the mesa structures is from 100 nanometers to 200 nanometers.

An apparatus to manufacture an electronic device comprising an insulating layer on a plurality of mesa structures in a trench on the substrate, the insulating layer filling a space outside the mesa structures; a nucleation layer on the mesa structures; and a III-V material layer on the nucleation layer, wherein the III-V material layer is laterally grown over the first insulating layer, and wherein the laterally grown III-V material layer is separated from the insulating layer by a space height of at least one of the mesa structures is from 100 nanometers to 200 nanometers.

A method to manufacture an electronic device comprising forming a plurality of mesa structures within a trench on a substrate; conformally depositing a first insulating layer within the trench; depositing a nucleation layer on the mesa structures; depositing a III-V material layer on the nucleation layer; and laterally growing the III-V material layer from the nucleation layer over the first insulating layer.

A method to manufacture an electronic device comprising forming a plurality of mesa structures within a trench on a substrate; conformally depositing a first insulating layer within the trench; depositing a nucleation layer on the mesa structures; depositing a III-V material layer on the nucleation layer; and laterally growing the III-V material layer from the nucleation layer over the first insulating layer; and depositing a device layer on the laterally grown III-V material layer.

A method to manufacture an electronic device comprising forming a plurality of mesa structures within a trench on a substrate; conformally depositing a first insulating layer within the trench; depositing a nucleation layer on the mesa structures; depositing a III-V material layer on the nucleation layer; and laterally growing the material layer from the nucleation layer over the first insulating layer, wherein the III-V material layer grows faster over the first insulating layer than over the nucleation layer.

A method to manufacture an electronic device comprising forming a plurality of mesa structures within a trench on a substrate; conformally depositing a first insulating layer within the trench; depositing a nucleation layer on the mesa structures; depositing a III-V material layer on the nucleation layer; and laterally growing the material layer from the nucleation layer over the first insulating layer, wherein forming the plurality of mesa structures comprises depositing a mask layer in the trench; patterning the mask layer; and etching the substrate through the patterned mask layer.

A method to manufacture an electronic device comprising forming a plurality of mesa structures within a trench on a substrate; conformally depositing a first insulating layer within the trench; depositing a nucleation layer on the mesa structures; depositing a III-V material layer on the nucleation layer; and laterally growing the material layer from the nucleation layer over the first insulating layer, wherein the laterally grown III-V material layer is in a direct contact with the first insulating layer.

A method to manufacture an electronic device comprising forming a plurality of mesa structures within a trench on a substrate; conformally depositing a first insulating layer within the trench; depositing a nucleation layer on the mesa structures; depositing a III-V material layer on the nucleation layer; and laterally growing the material layer from the nucleation layer over the first insulating layer, wherein at least one of the mesa structures has a square shape; rectangular shape, or a polygon shape.

A method to manufacture an electronic device comprising forming a plurality of mesa structures within a trench on a substrate; conformally depositing a first insulating layer within the trench; depositing a nucleation layer on the mesa structures; depositing a III-V material layer on the nucleation layer; and laterally growing the material layer from the nucleation layer over the first insulating layer, wherein the III-V material layer is separated from the insulating layer by a space.

What is claimed is:

1. An electronic device, comprising:
   a mesa structure having a top surface and a sidewall on a substrate, wherein the mesa structure is aligned along a $\{0001\}$ crystal orientation;
   a first insulating layer on the sidewall of the mesa structure;
   a III-V material layer on the top surface of the mesa structure, wherein the III-V material layer has a lateral epitaxial overgrowth portion on the first insulating layer.

2. The electronic device of claim 1, further comprising a nucleation layer on the top portion of the mesa structure.

3. The electronic device of claim 1, further comprising a device layer on the lateral epitaxial overgrowth portion.

4. The electronic device of claim 1, wherein the III-V material layer includes GaN and the mesa structure includes silicon.

5. The electronic device of claim 1, wherein the first insulating layer includes silicon oxide, silicon nitride, or a combination thereof.

6. The electronic device of claim 1, wherein the mesa structure is within a trench in a second insulating layer on the substrate.

7. The electronic device of claim 1, wherein the mesa structure has a square shape; rectangular shape, or a polygon shape.

8. The electronic device of claim 1, wherein the lateral epitaxial overgrowth portion layer is in direct contact with the first insulating layer.

9. The electronic device of claim 1, wherein a bottom surface of the laterally extended III-V material layer is not in direct contact with the insulating layer.

10. The electronic device of claim 1, wherein the size of at least one of the mesa structures is from 2 microns to 10 microns.

11. A system comprising:
    a chip including an electronic device comprising a mesa structure having a top surface and a sidewall on a substrate, wherein the mesa structure is aligned along a $\{0001\}$ crystal orientation;
    a first insulating layer on the sidewall of the mesa structure;
    a III-V material layer on the top surface of the mesa structure, wherein the III-V material layer has a lateral epitaxial overgrowth portion on the first insulating layer.

12. The system of claim 11, further comprising a nucleation layer on the top portion of the mesa structure.

13. A method to manufacture an electronic device comprising:
    forming a mesa structure comprising a top surface and a sidewall on a substrate;
    depositing a first insulating layer on the sidewall of the mesa structure;
    depositing a III-V material layer on the top surface of the mesa structure; and
    laterally growing the III-V material layer from the top surface over the first insulating layer, wherein forming the mesa structure comprises:
        depositing a mask layer in a trench in a second insulating layer on the substrate;
        patterning the mask layer; and
        etching the substrate through the patterned mask layer.

14. The method of claim 13, further comprising depositing a nucleation layer on the top surface of the mesa structure.

15. The method of claim 13, further comprising depositing a device layer on the laterally grown III-V material layer.

16. The method of claim 13, wherein the laterally grown III-V material layer is in a direct contact with the first insulating layer.

17. The method of claim 13, wherein the III-V material layer is separated from the first insulating layer by a space.

18. The method of claim 13, further comprising depositing a second insulating layer on the substrate; patterning the second insulating layer; etching the substrate through the patterned second insulating layer to form the trench.

* * * * *